(12) United States Patent
Yu et al.

(10) Patent No.: US 9,406,676 B2
(45) Date of Patent: Aug. 2, 2016

(54) METHOD FOR FORMING SINGLE DIFFUSION BREAKS BETWEEN FINFET DEVICES AND THE RESULTING DEVICES

(71) Applicant: GLOBALFOUNDRIES Inc., Grand Cayman (KY)

(72) Inventors: Hong Yu, Rexford, NY (US); HongLiang Shen, Ballston Lake, NY (US); Zhenyu Hu, Clifton Park, NY (US); Jin Ping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/676,165

(22) Filed: Apr. 1, 2015

(65) Prior Publication Data
US 2016/0190130 A1    Jun. 30, 2016

Related U.S. Application Data

(60) Provisional application No. 62/097,265, filed on Dec. 29, 2014.

(51) Int. Cl.
*H01L 21/76*  (2006.01)
*H01L 21/762*  (2006.01)
(Continued)

(52) U.S. Cl.
CPC ...... *H01L 27/0886* (2013.01); *H01L 21/28008* (2013.01); *H01L 21/30604* (2013.01); *H01L 21/31051* (2013.01); *H01L 21/31111* (2013.01); *H01L 21/31144* (2013.01); *H01L 21/76224* (2013.01); *H01L 21/823431* (2013.01); *H01L 21/823437* (2013.01); *H01L 21/823481* (2013.01); *H01L 29/0649* (2013.01); *H01L 29/6656* (2013.01); *H01L 29/6681* (2013.01); *H01L 29/66545* (2013.01); *H01L 29/7851* (2013.01)

(58) Field of Classification Search
CPC .............. H01L 27/0886; H01L 21/31051; H01L 21/31111; H01L 21/30604; H01L 21/823431; H01L 21/76224; H01L 21/823437; H01L 21/823481; H01L 21/28008; H01L 21/31144; H01L 29/0649; H01L 29/7851; H01L 29/6681; H01L 29/66545; H01L 29/6656
USPC .......... 438/157, 176, 221, 270, 424; 257/268, 257/288, 392, 401, E21.409, E21.421, 257/E21.633, E29.001, E29.116, E29.151
See application file for complete search history.

(56) References Cited

U.S. PATENT DOCUMENTS 8,609,510 B1 * 12/2013 Banna ............... H01L 29/66545
  257/E21.409
9,171,752 B1 * 10/2015 Wu ................... H01G 21/76224
(Continued)

*Primary Examiner* — Dao H Nguyen
(74) *Attorney, Agent, or Firm* — Amerson Law Firm, PLLC

(57) ABSTRACT

A method includes forming a fin in a semiconductor substrate. A plurality of sacrificial gate structures are formed above the fin. A selected one of the sacrificial gate structures is removed to define a first opening that exposes a portion of the fin. An etch process is performed through the first opening on the exposed portion of the fin to define a first recess in the fin. The first recess is filled with a dielectric material to define a diffusion break in the fin. A device includes a fin defined in a substrate, a plurality of gates formed above the fin, a plurality of recesses filled with epitaxial material defined in the fin, and a diffusion break defined at least partially in the fin between two of the recesses filled with epitaxial material and extending above the fin.

14 Claims, 25 Drawing Sheets

(51) Int. Cl.
  *H01L 27/088*   (2006.01)
  *H01L 29/66*    (2006.01)
  *H01L 21/306*   (2006.01)
  *H01L 21/3105*  (2006.01)
  *H01L 21/311*   (2006.01)
  *H01L 21/28*    (2006.01)
  *H01L 29/78*    (2006.01)
  *H01L 29/06*    (2006.01)
  *H01L 21/8234*  (2006.01)

(56) References Cited

U.S. PATENT DOCUMENTS

2014/0327087 A1* 11/2014 Kim .................. H01L 27/10826
  257/392
2015/0054089 A1*  2/2015 Hong ................. H01L 27/0886
  257/401
2015/0294969 A1* 10/2015 Lee .................... H01L 27/0886
  257/401

* cited by examiner

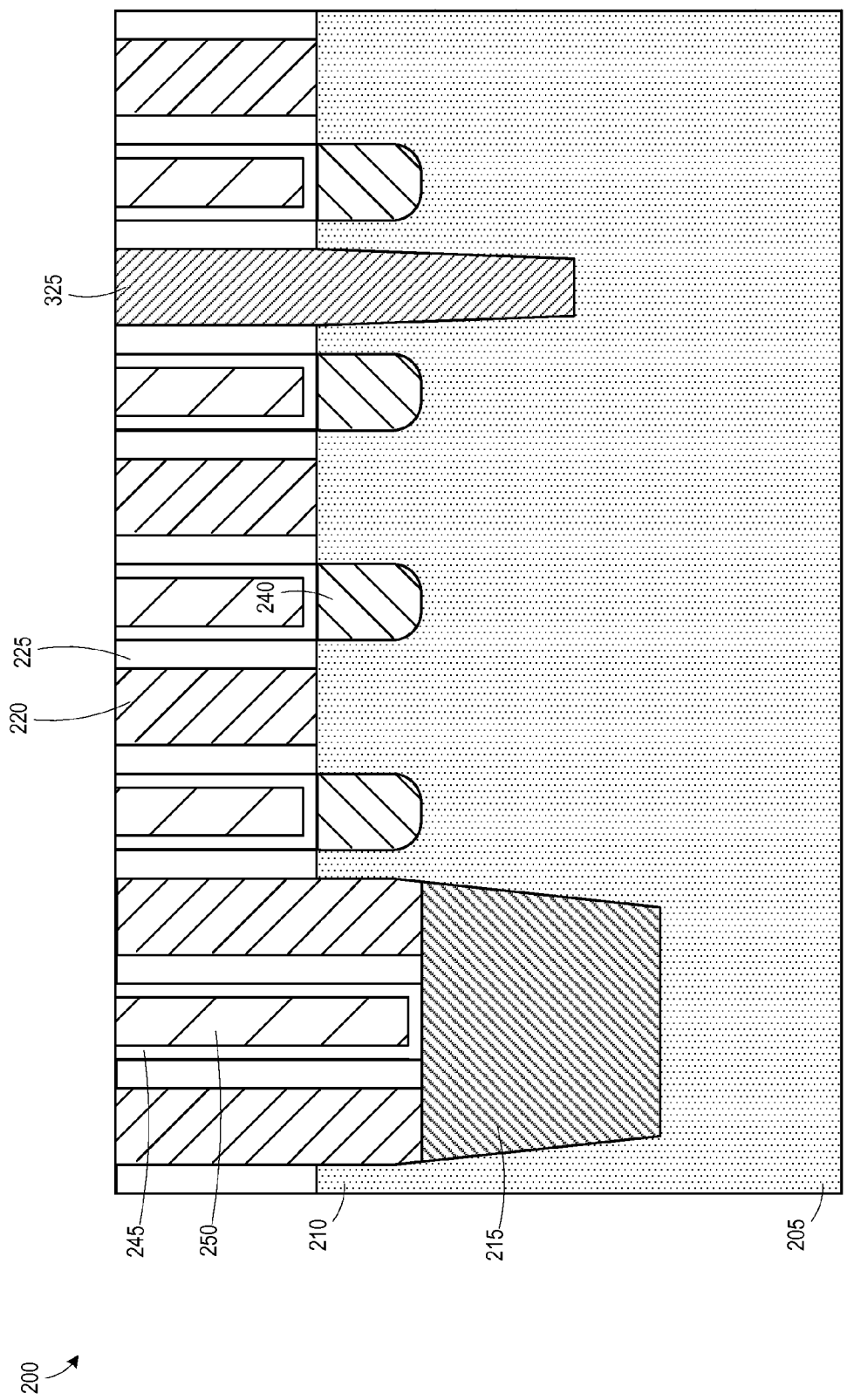

METHOD FOR FORMING SINGLE DIFFUSION BREAKS BETWEEN FINFET DEVICES AND THE RESULTING DEVICES

BACKGROUND OF THE INVENTION

1. Field of the Invention

The present disclosure generally relates to the fabrication of semiconductor devices, and, more particularly, to a method for forming a single diffusion break between finFET devices and the resulting devices.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered, and irrespective of whether it is a planar or 3D finFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called finFET device has a three-dimensional (3D) structure. FIG. 1A is a side view of an illustrative prior art finFET semiconductor device 100 that is formed above a semiconductor substrate 105. In this example, the finFET device 100 includes three illustrative fins 110, a gate structure 115, sidewall spacers 120, and a gate cap 125. The gate structure 115 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 110 have a three-dimensional configuration. The portions of the fins 110 covered by the gate structure 115 is the channel region of the finFET device 100. An isolation structure 130 is formed between the fins 110. In a conventional process flow, the portions of the fins 110 that are positioned outside of the spacers 120, i.e., in the source/drain regions of the device 100, may be increased in size or even merged together by performing one or more epitaxial growth processes. The process of increasing the size of the fins 110 in the source/drain regions of the device 100 is performed to reduce the resistance of source/drain regions and/or make it easier to establish electrical contact to the source/drain regions.

A particular fin 110 may be used to fabricate multiple devices. FIG. 1B illustrates a cross-sectional view of the finFET device 100 along the length of one fin 110 prior to the formation of any gate structures 115. One or more diffusion breaks 135, 140 are formed along the axial length of the fin 110 to define separate fin portions by removing a portion of the fin 110 and replacing it with a dielectric material. The strength of the isolation provided by the diffusion break 135, 140 depends on its size. A diffusion break having a lateral width (in the current transport direction, or gate length (GL) direction of the completed devices) corresponding to the lateral width of two adjacent gate structures 115 (later formed) is referred to as a double diffusion break 135, and a diffusion break having a lateral width corresponding to the lateral width of one gate structure 115 is referred to as a single diffusion break 140. The process for forming the single diffusion break gouges the fin 110 and defines recesses 145.

FIG. 1C illustrates the device 100 after a plurality of processes were performed to define a plurality of gate structures 115, with cap layers 125, and sidewall spacers 120 above the fin 110. FIG. 1D illustrates the device 100 after a self-aligned etch process was performed to recess the fin 110 using the gate structures 115 and spacers 120 as an etch mask to define recesses 150, 155 in the fin 110. Because of the fin gouging, the recesses 150 adjacent the single diffusion break 140 are deeper than the other recesses 155.

FIG. 1E illustrates the device 100 after an epitaxial growth process was performed to define epitaxial regions 160, 165 in the recesses 150, 155. Due to the difference in the depth of the recesses 150, 155, the post-fill height of the epitaxial region 160 is less than that of the epitaxial region 165. This epitaxial material underfill changes the electrical characteristics of the device 100 in the region adjacent to the single diffusion break 140 as compared to the regions without underfill.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. One illustrative method includes forming a fin in a semiconductor substrate. A plurality of sacrificial gate structures are formed above the fin. A selected one of the sacrificial gate structures is removed to define a first opening that exposes a portion of the fin. An etch process is performed through the first opening on the exposed portion of the fin to define a first recess in the fin. The first recess is filled with a dielectric material to define a diffusion break in the fin.

One illustrative device disclosed herein includes, among other things, a fin defined in a substrate, a plurality of gates formed above the fin, a plurality of recesses filled with epitaxial material defined in the fin, and a diffusion break defined at least partially in the fin between two of the recesses filled with epitaxial material and extending above the fin.

BRIEF DESCRIPTION OF THE DRAWINGS

The disclosure may be understood by reference to the following description taken in conjunction with the accompanying drawings, in which like reference numerals identify like elements, and in which:

FIGS. 3A-3H depict an alternative method disclosed herein of forming single diffusion breaks in a finFET device.

Figure 1A:
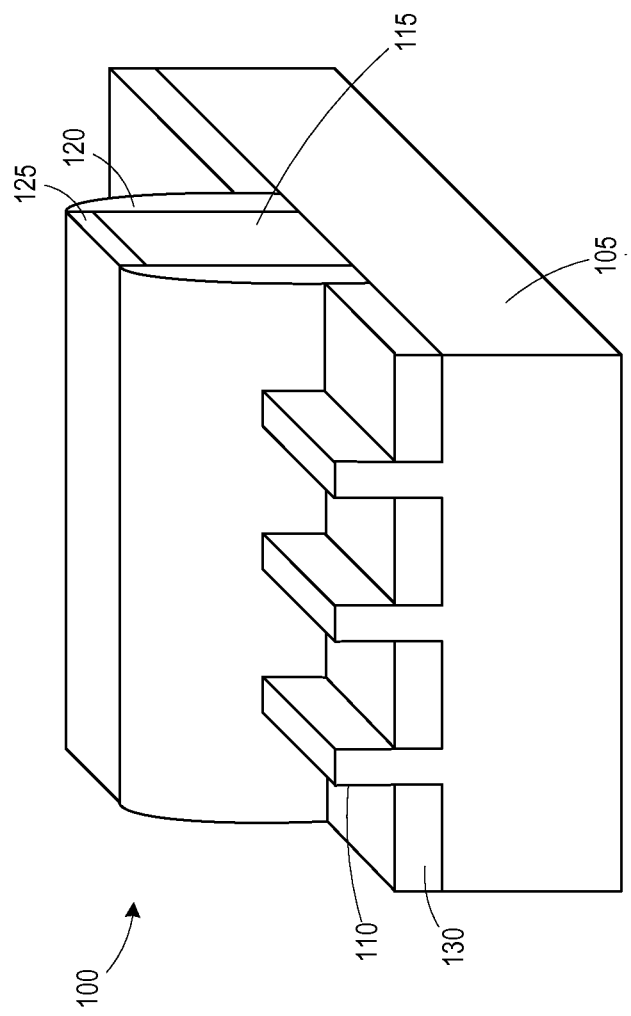
FIGS. 1A-1E schematically depict an illustrative prior art finFET device.
Figure 1B:
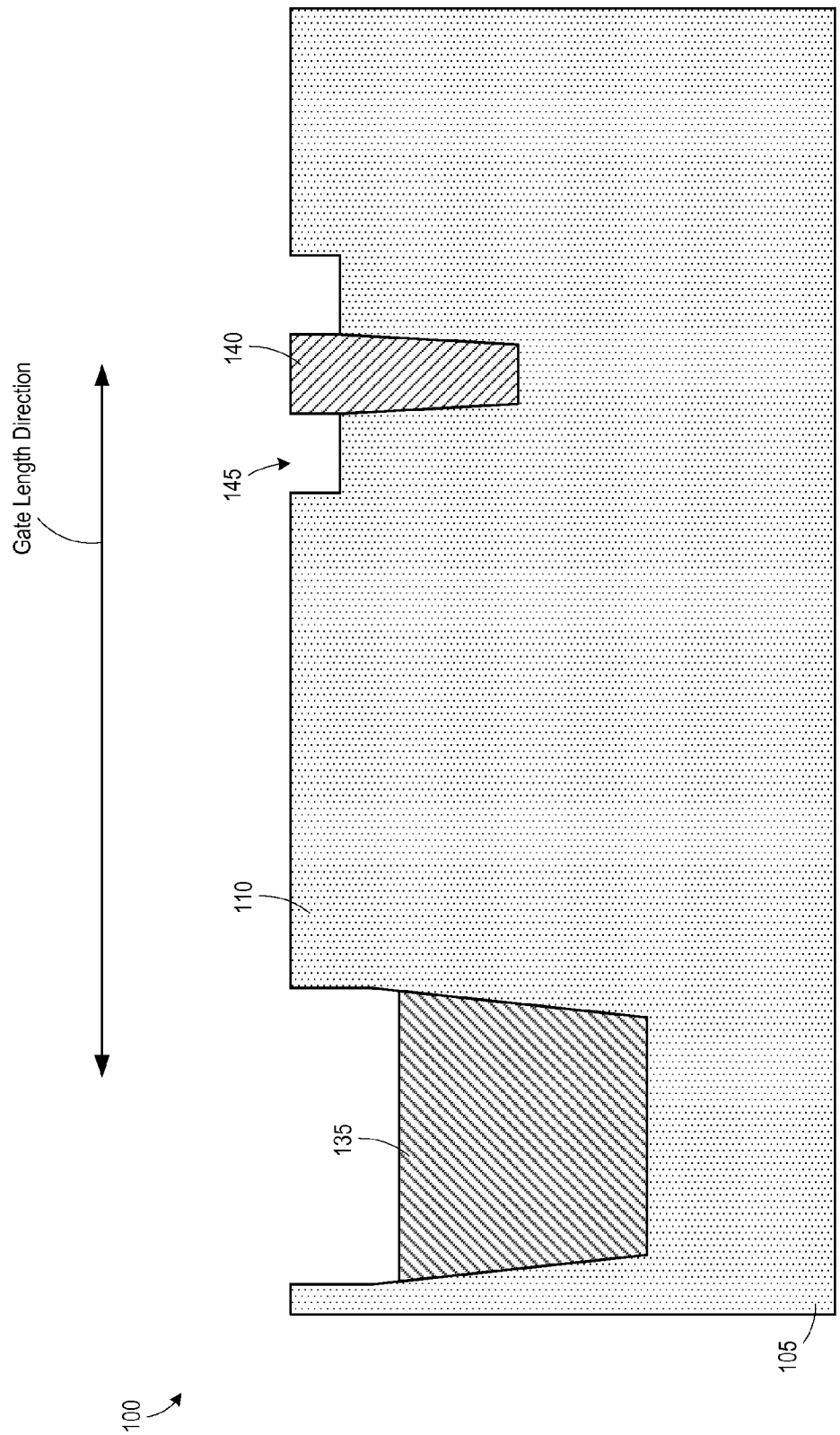
Figure 1C:
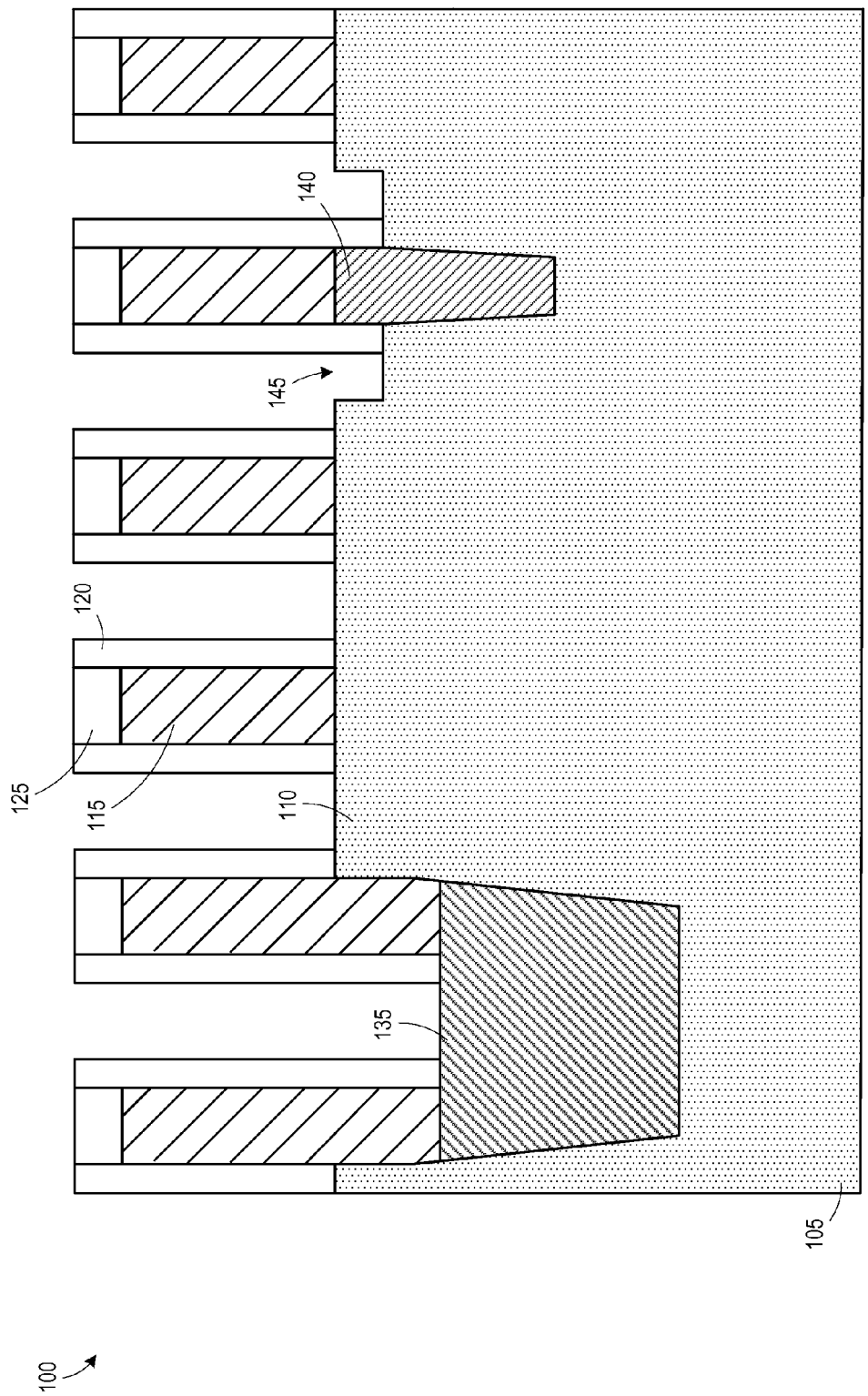
Figure 1D:
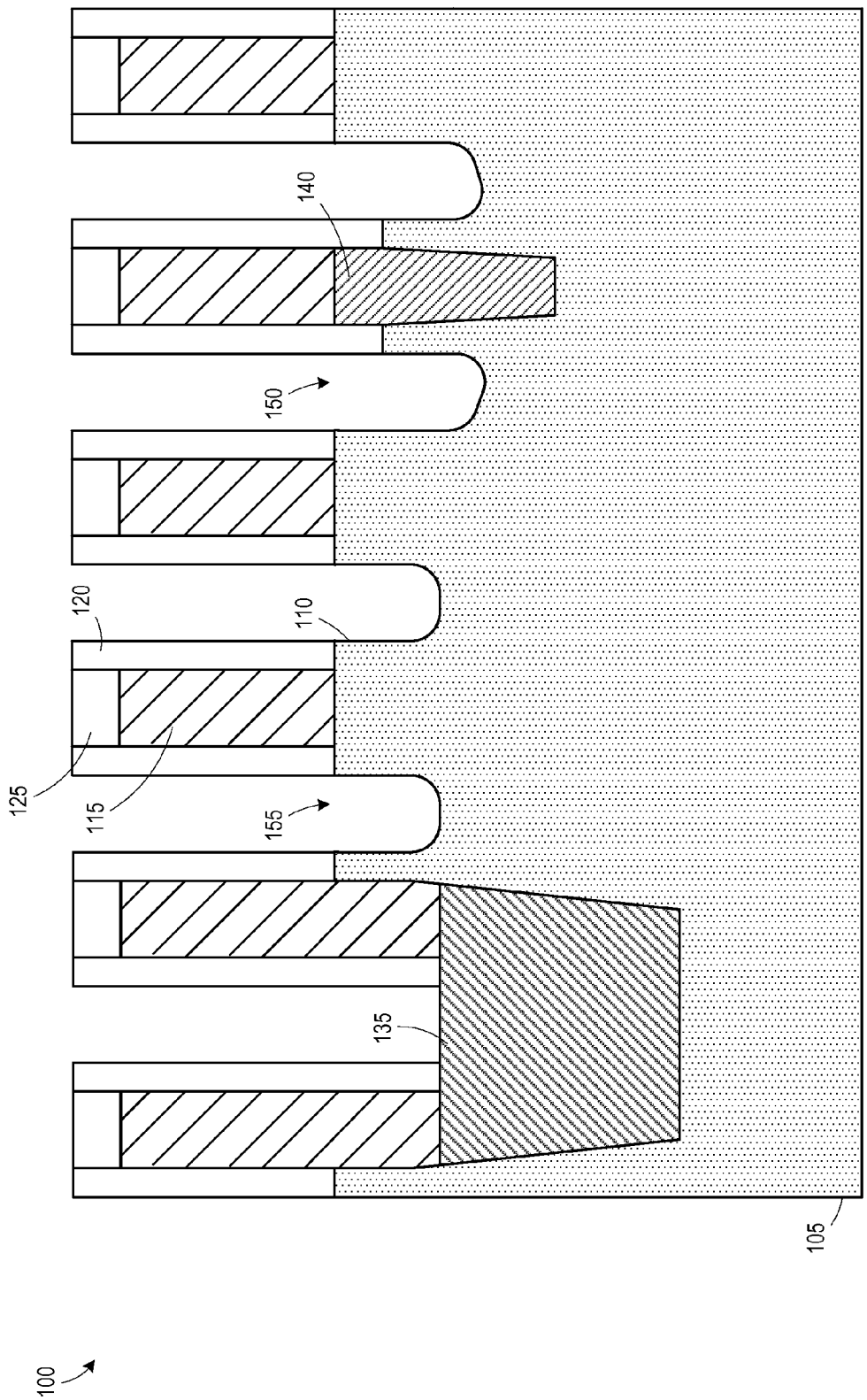
Figure 1E:
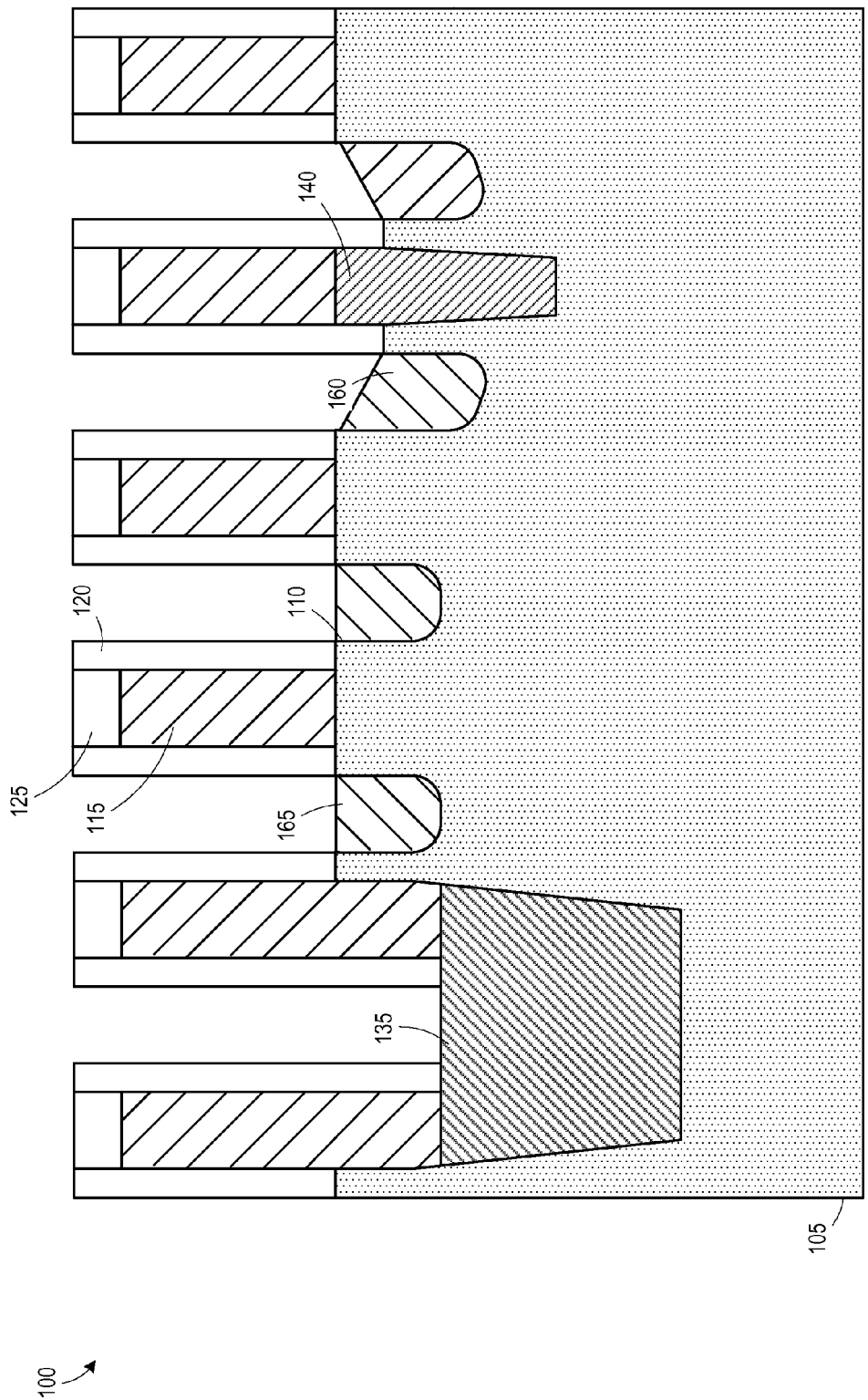

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming finFET devices with a single diffusion break without causing significant underfill of epitaxial semiconductor regions formed in the fin and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2J illustrate various methods for forming a single diffusion break between finFETs in a device 200. FIGS. 2A-2J show a cross-sectional view of the device 200 along the axial length of an illustrative fin 210 defined in a substrate 205 with a double diffusion break 215 (e.g., silicon dioxide) defined in the fin 210. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers. For example, the fin 210 may be formed in a process layer formed above the base layer of the substrate 205.

Figure 2A:
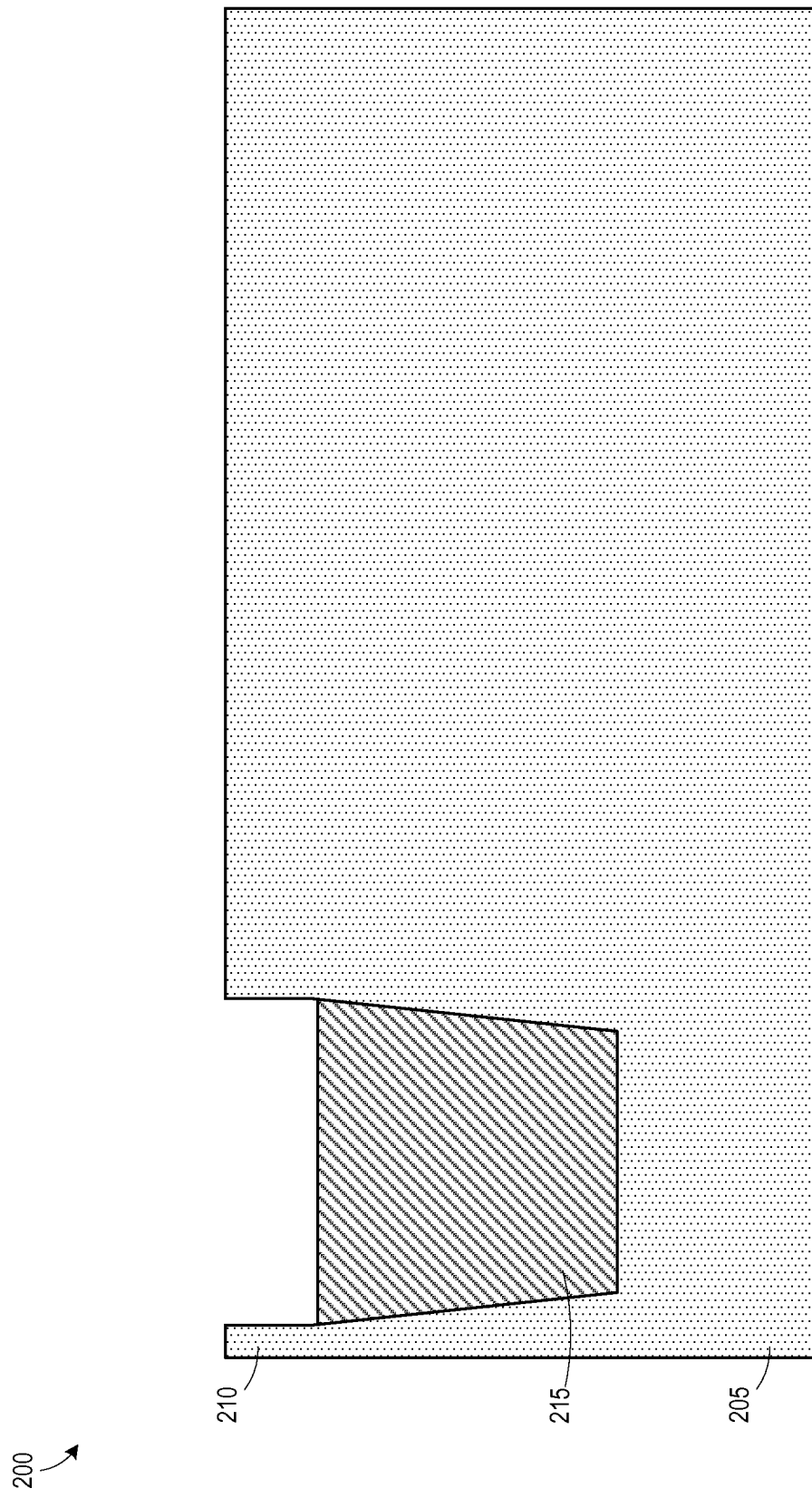
FIGS. 2A-2L depict various methods disclosed herein of forming single diffusion breaks in a finFET device.
Figure 2B:
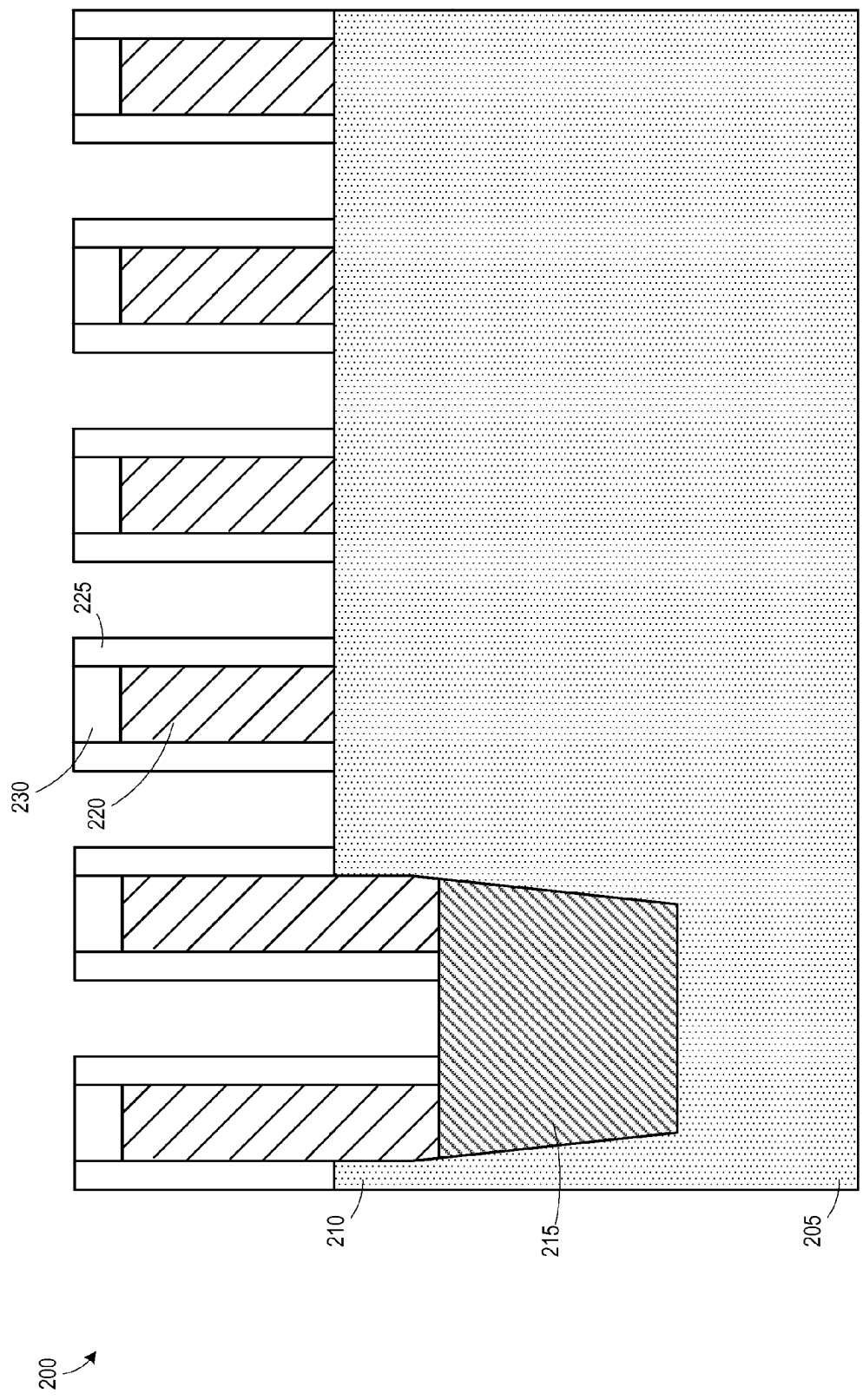

FIG. 2B illustrates the device after several processes were performed to define placeholder gate structures 220 (e.g., polysilicon) above the fin 210. A cap layer 230 (e.g., silicon nitride) is formed above the placeholder gate structure 220, and sidewall spacers 225 (e.g., silicon nitride) are formed on the placeholder gate structure 220. Techniques for forming the gate structures 220 are known to those of ordinary skill in the art. In the illustrative embodiment, a replacement gate technique is used to form the finFET device 200, and the placeholder gate electrode structure 220 is illustrated prior to the formation of the replacement gate structure. The placeholder gate structure 220 includes a sacrificial gate electrode material (not separately shown), such as polysilicon, and a sacrificial gate insulation layer (not separately shown), such as silicon dioxide.

Figure 2C:
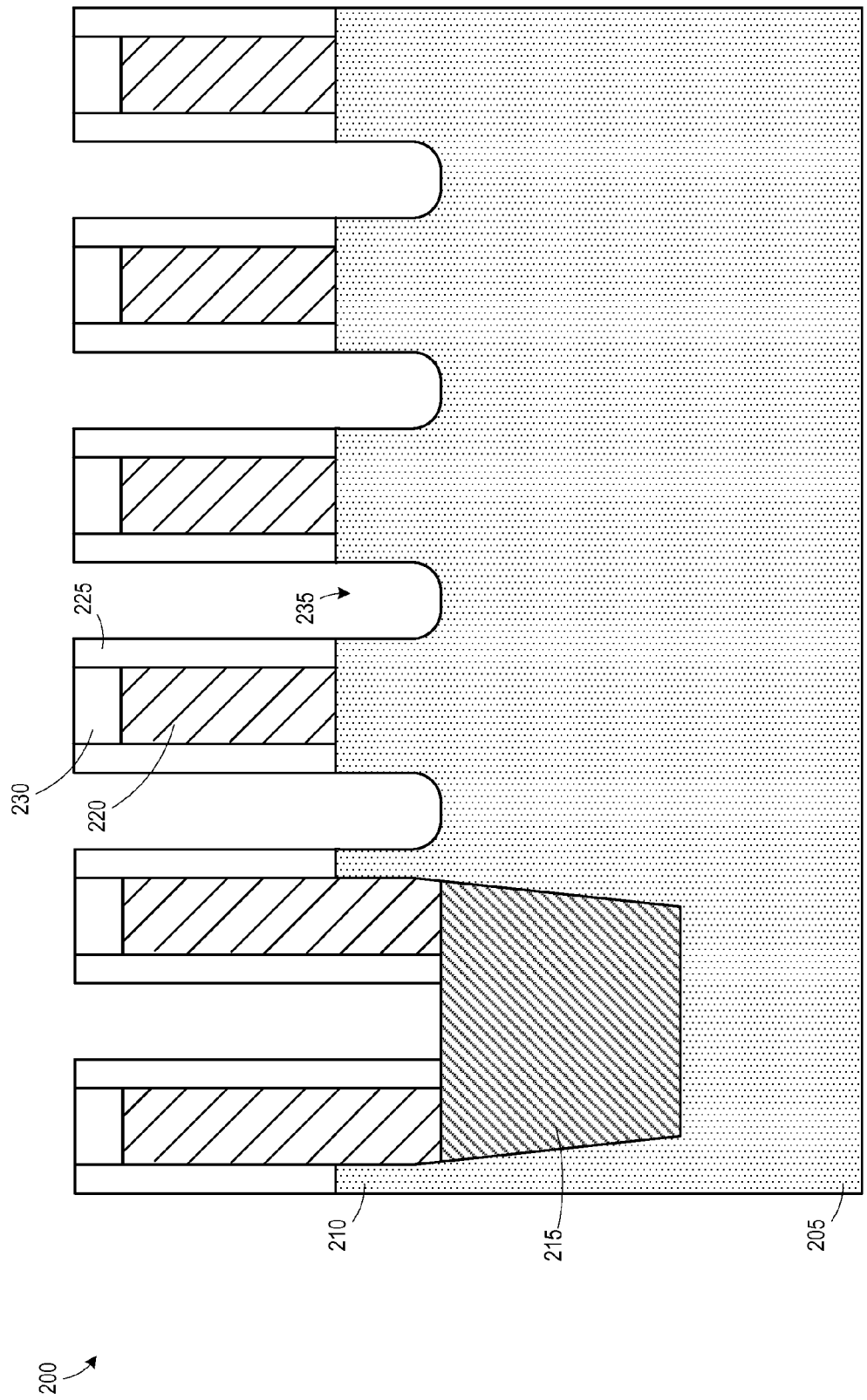

FIG. 2C illustrates the device 200 after a self-aligned etch process was performed using the placeholder gate structures 220 and sidewall spacers 225 as an etch mask to define recesses 235 in the fin 210.

Figure 2D:
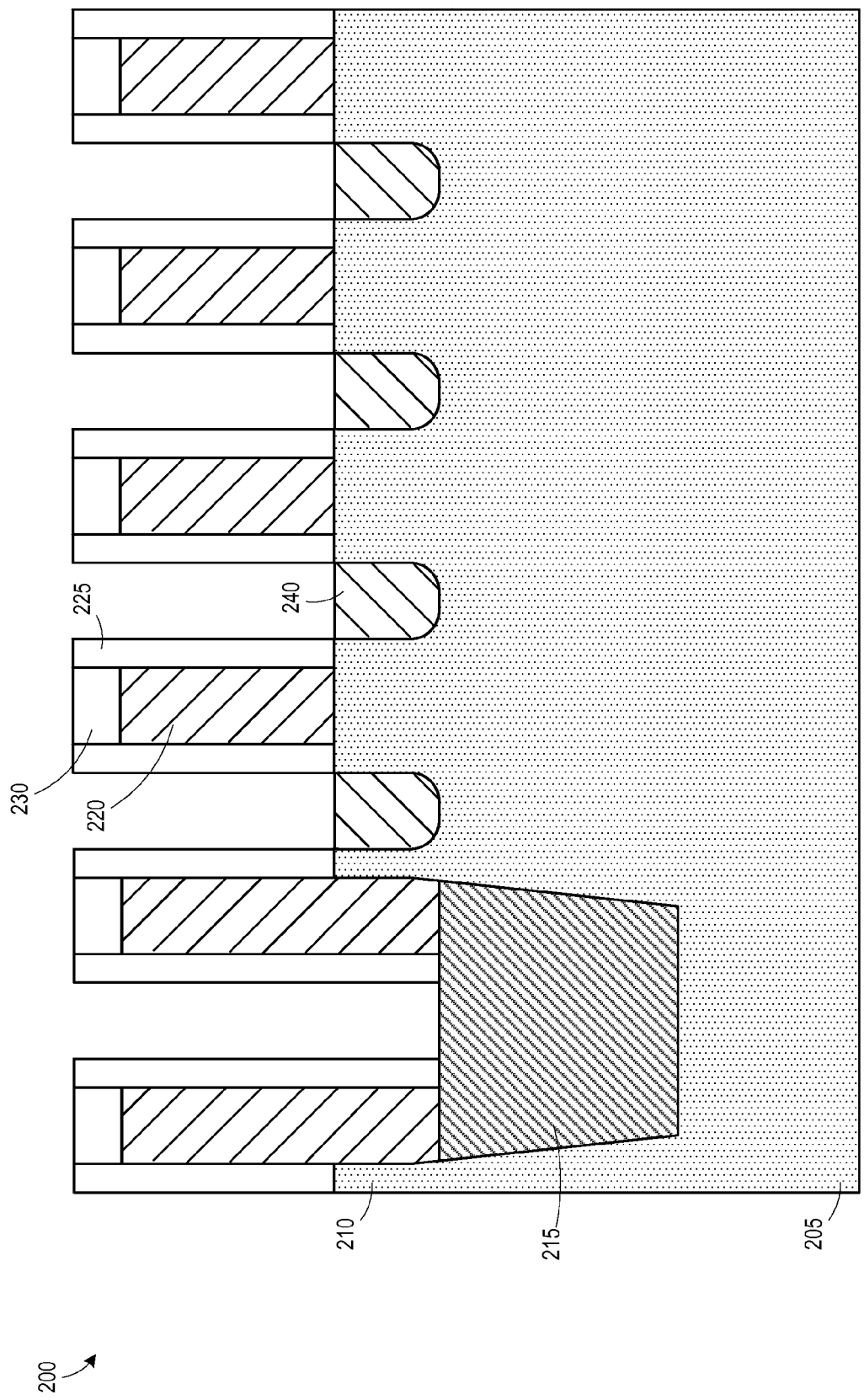

FIG. 2D illustrates the device 200 after an epitaxial growth process was performed to form epitaxial material 240 in the recesses 235. The epitaxial semiconductor material 240 will become part of subsequently defined source/drain regions of the device 200. The epitaxial material 240 may be comprised of different materials and it may be a strain-inducing material, such as silicon germanium or silicon carbon, formed on a silicon fin 210 or silicon formed on a silicon germanium or silicon carbon fin 210. The epitaxial material 240 may be doped in situ or an implantation process may be performed to dope the epitaxial material 240 in the source/drain regions of the device 200. The gate cap layer 230 and the spacers 225 shield a portion of the fin 210 in a channel region of the device 200 during the epitaxial material growth process. In one embodiment, the fin 210 may not have been doped prior to the epitaxial growth process. An implantation process may be performed after the epitaxial material growth process to dope both the fin 210 and the epitaxial material 240. If a lightly doped source/drain region is desired, an implant process may be performed on the fin 210 after forming the placeholder gate electrode structure 220, but prior to forming the spacers 225.

Figure 2E:
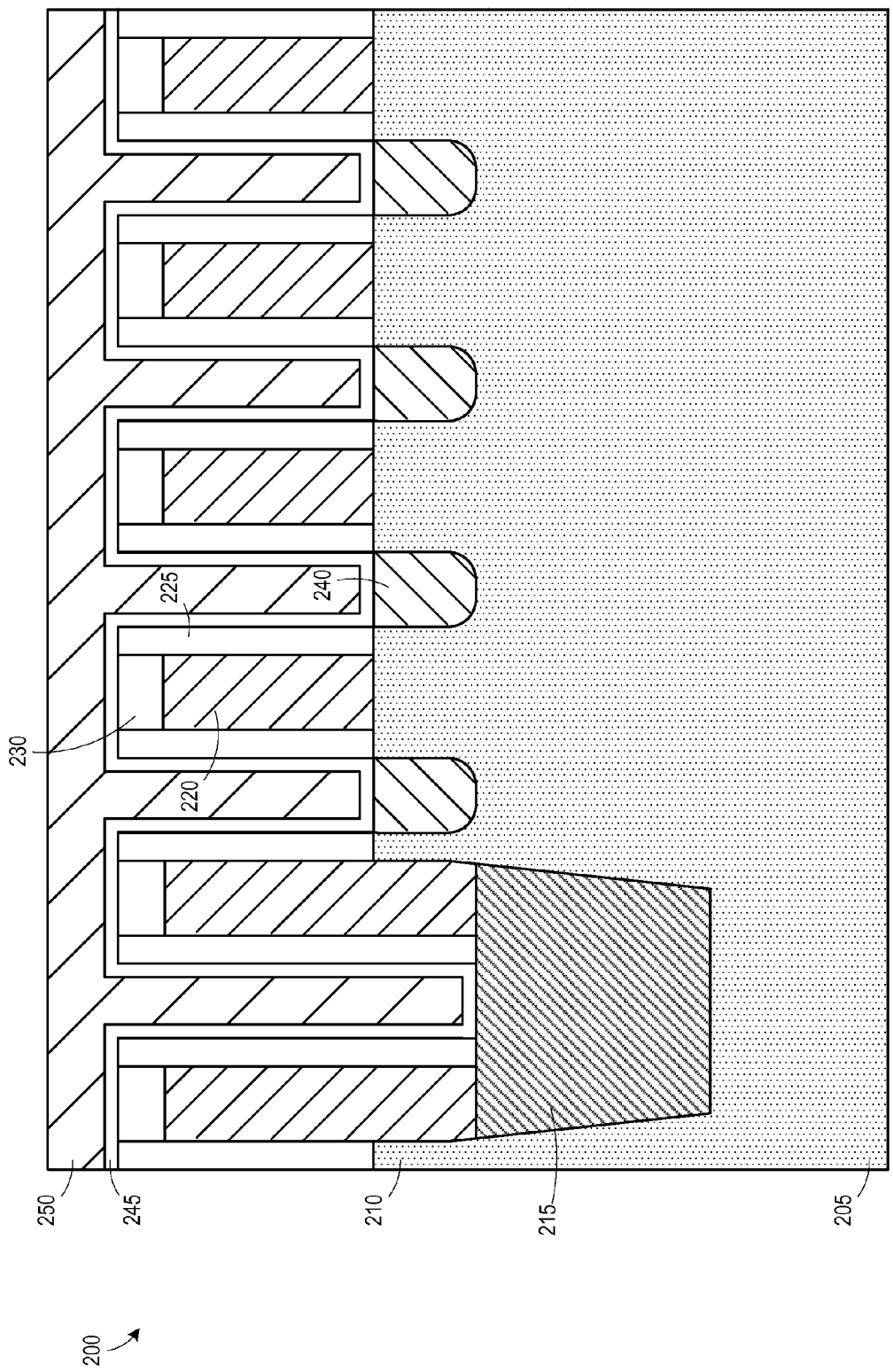

FIG. 2E illustrates the device 200 after a first conformal deposition process was performed to deposit an etch stop layer 245 (e.g., silicon nitride) above the epitaxial material 240 and a second blanket deposition process was performed to deposit an interlayer dielectric (ILD) layer 250 above the device 200. An exemplary material for the ILD layer 250 is silicon dioxide or a low-k dielectric material (k value less than about 3.5). The etch stop layer 245 may be a stress-inducing etch stop layer.

Figure 2F:
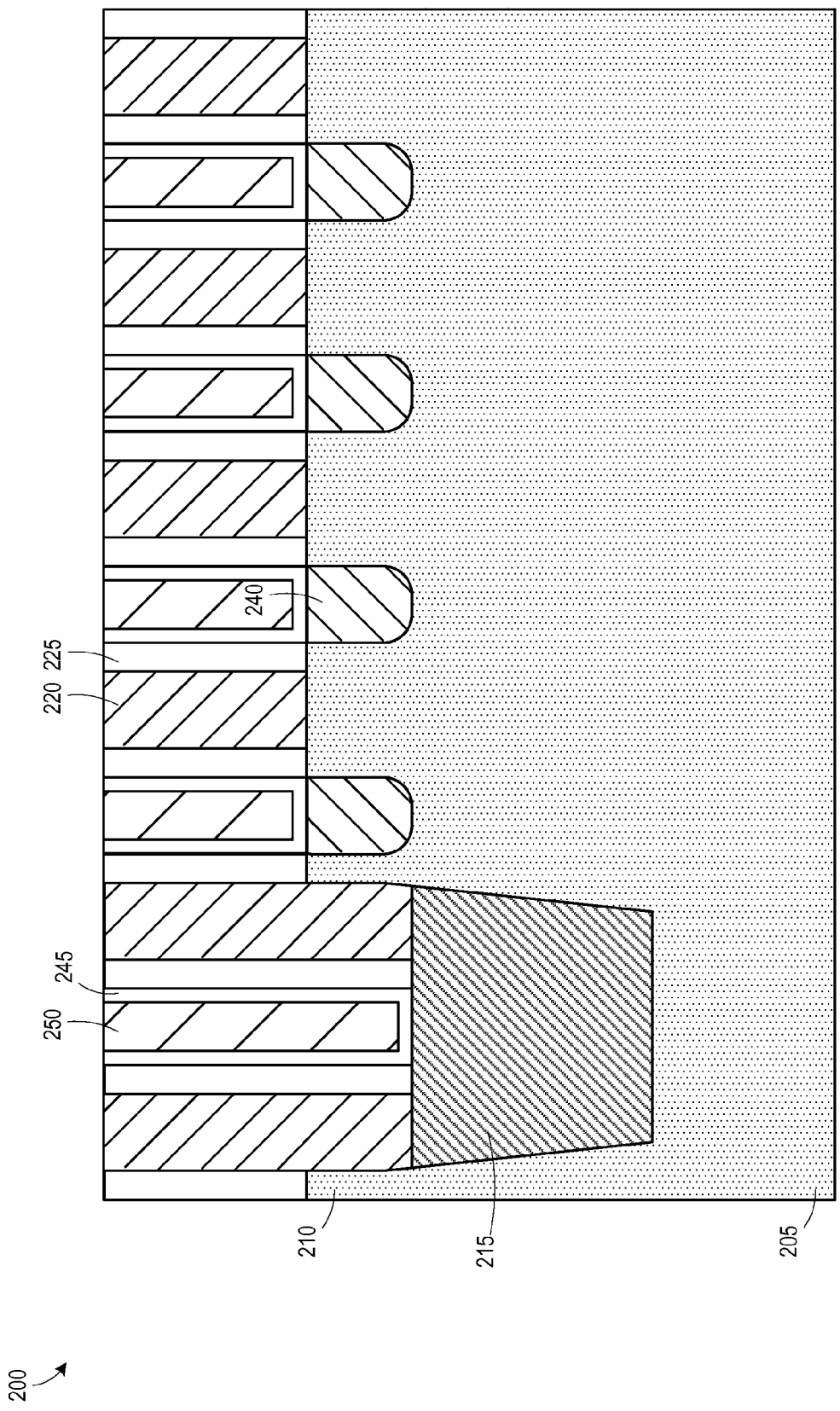

FIG. 2F illustrates the device 200 after a planarization process (e.g., an etching and/or CMP process) was performed to remove portions of the ILD layer 250, the etch stop layer 245, and the cap layer 230 and thereby expose a top surface of the placeholder gate structures 220.

Figure 2G:
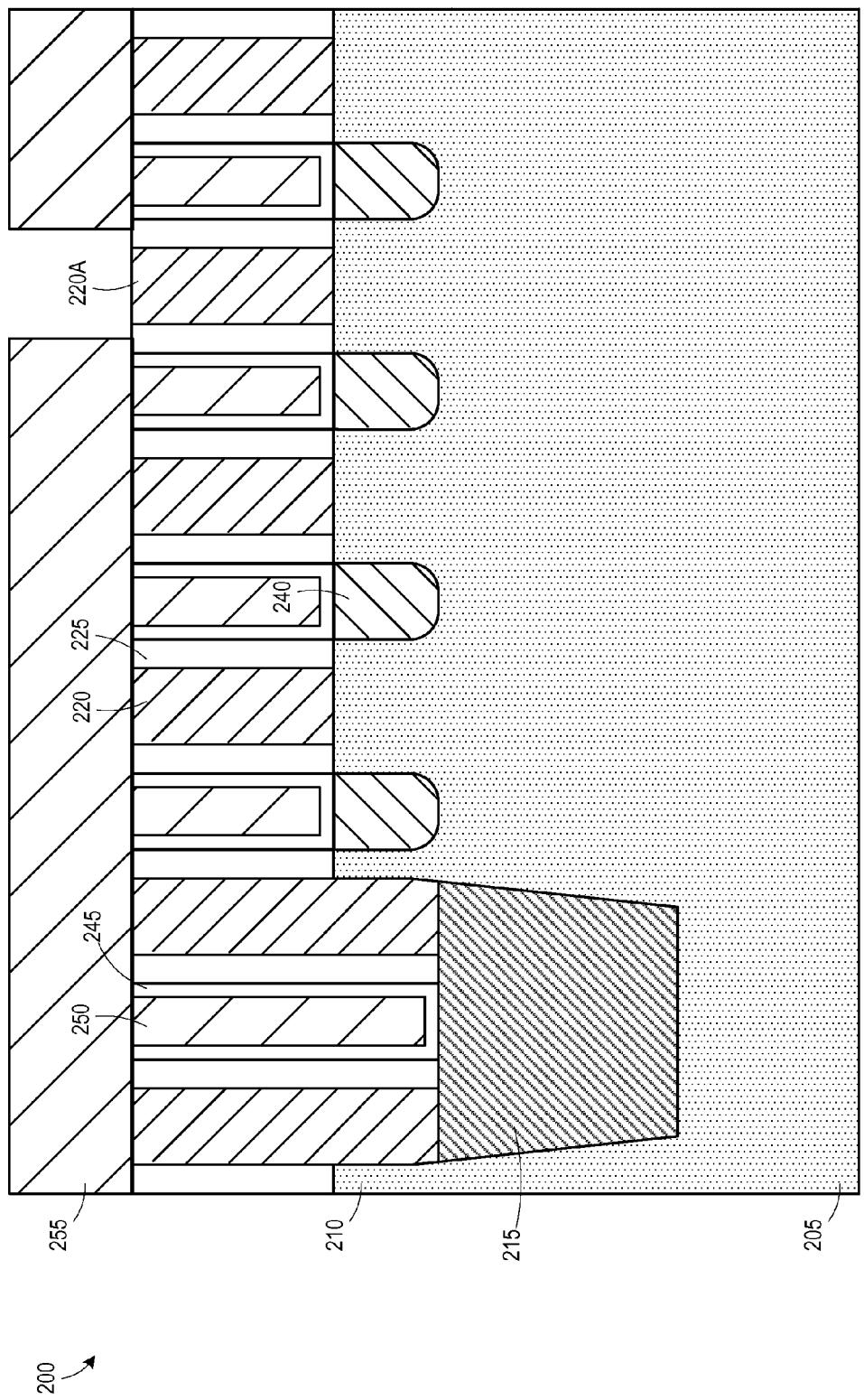

FIG. 2G illustrates the device 200 after a patterned etch mask layer 255 was formed above the ILD layer 250 to expose a selected placeholder gate structure 220A.

Figure 2H:
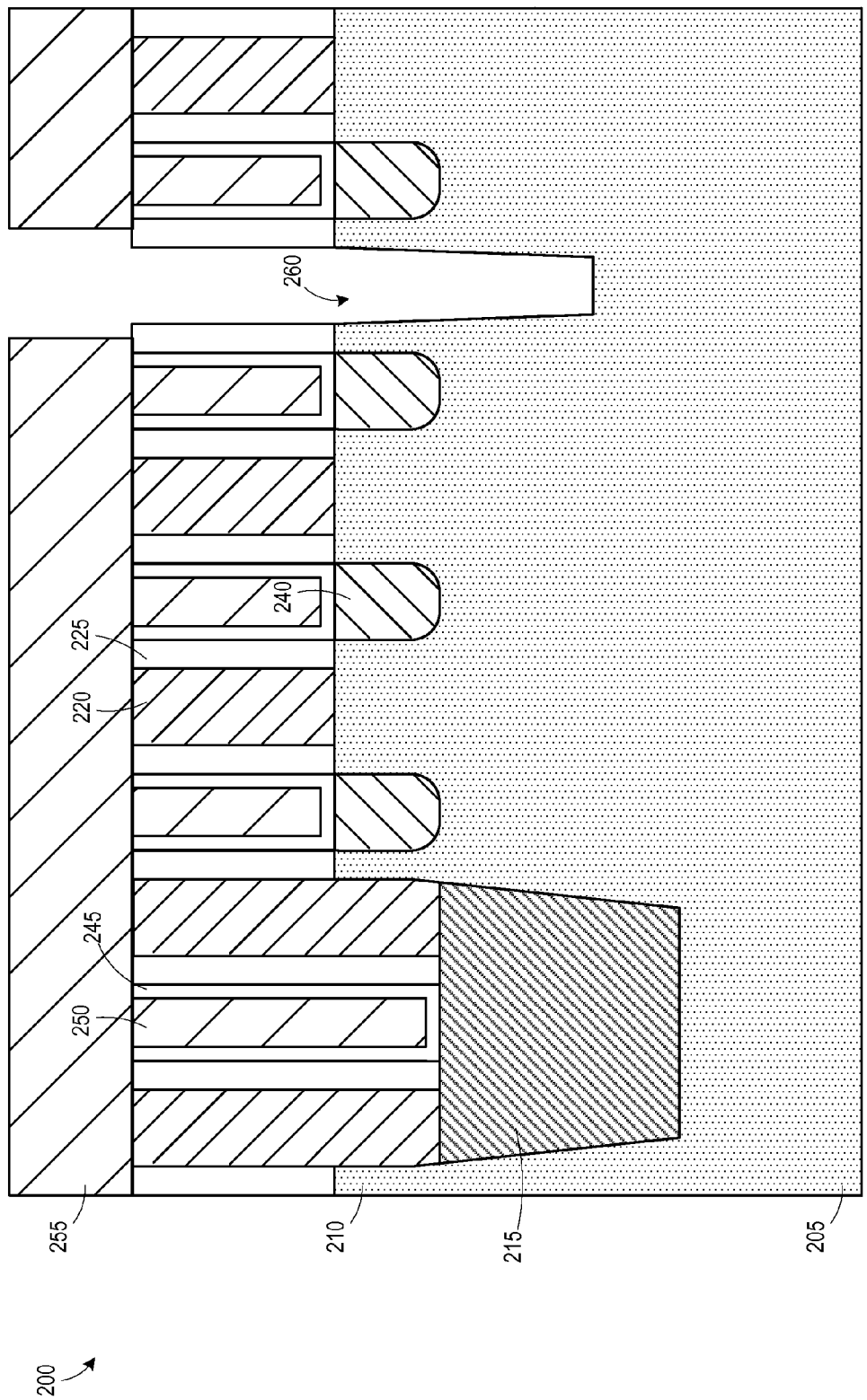

FIG. 2H illustrates the device 200 after a first etch process was performed to remove the selected placeholder gate structure 220A and a second etch process was performed to define a recess 260 in the fin 210.

Figure 2I:
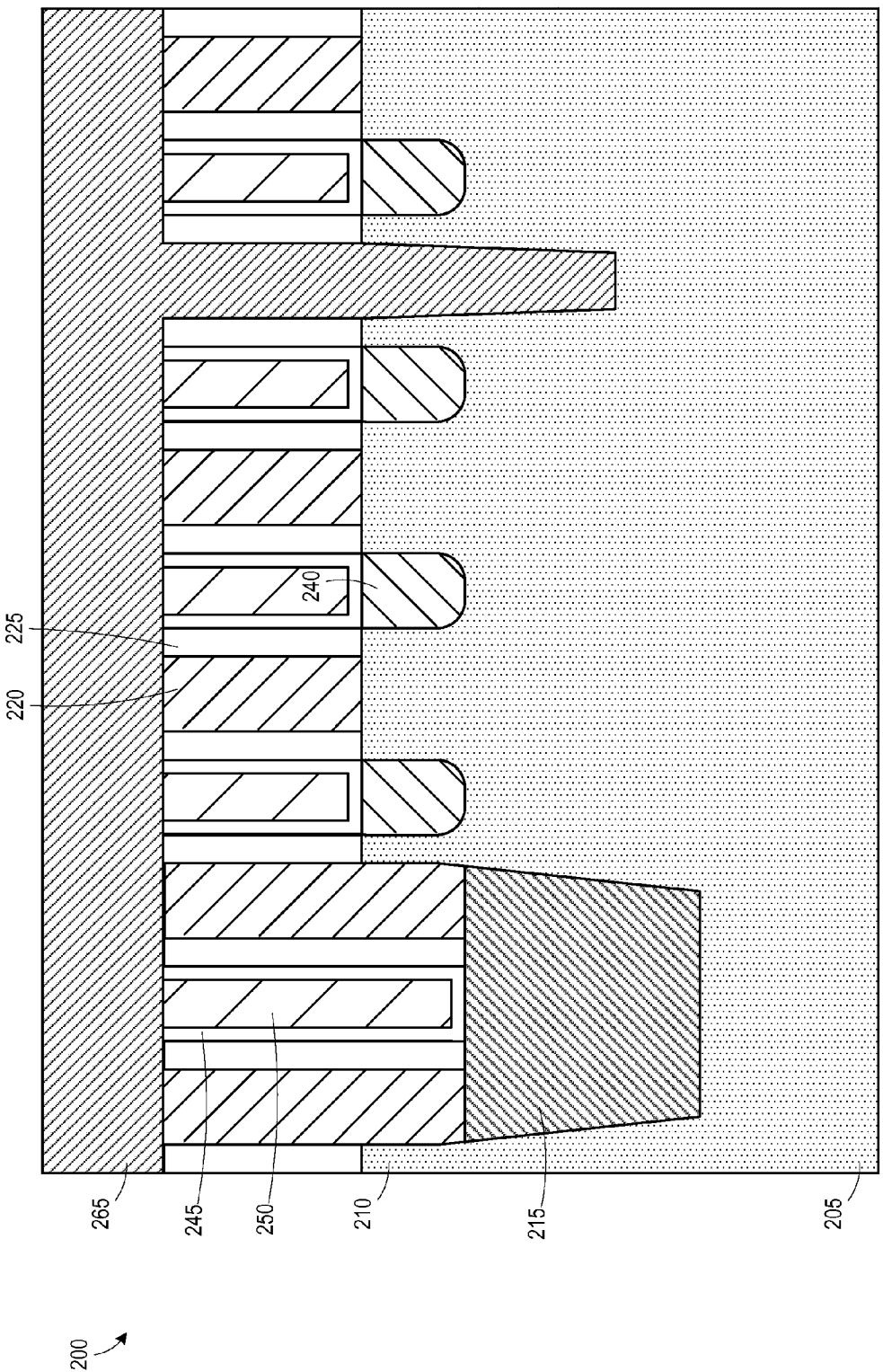

FIG. 2I illustrates the device 200 after a stripping process was performed to remove the patterned etch mask layer 255 and a deposition process was performed to deposit a dielectric layer 265 (e.g., silicon dioxide) to over-fill the recess 260 and the space created by the removal of the selected placeholder gate structure 220A. In some embodiments, the dielectric layer 265 may be formed using the same material as the double diffusion break 215.

Figure 2J:
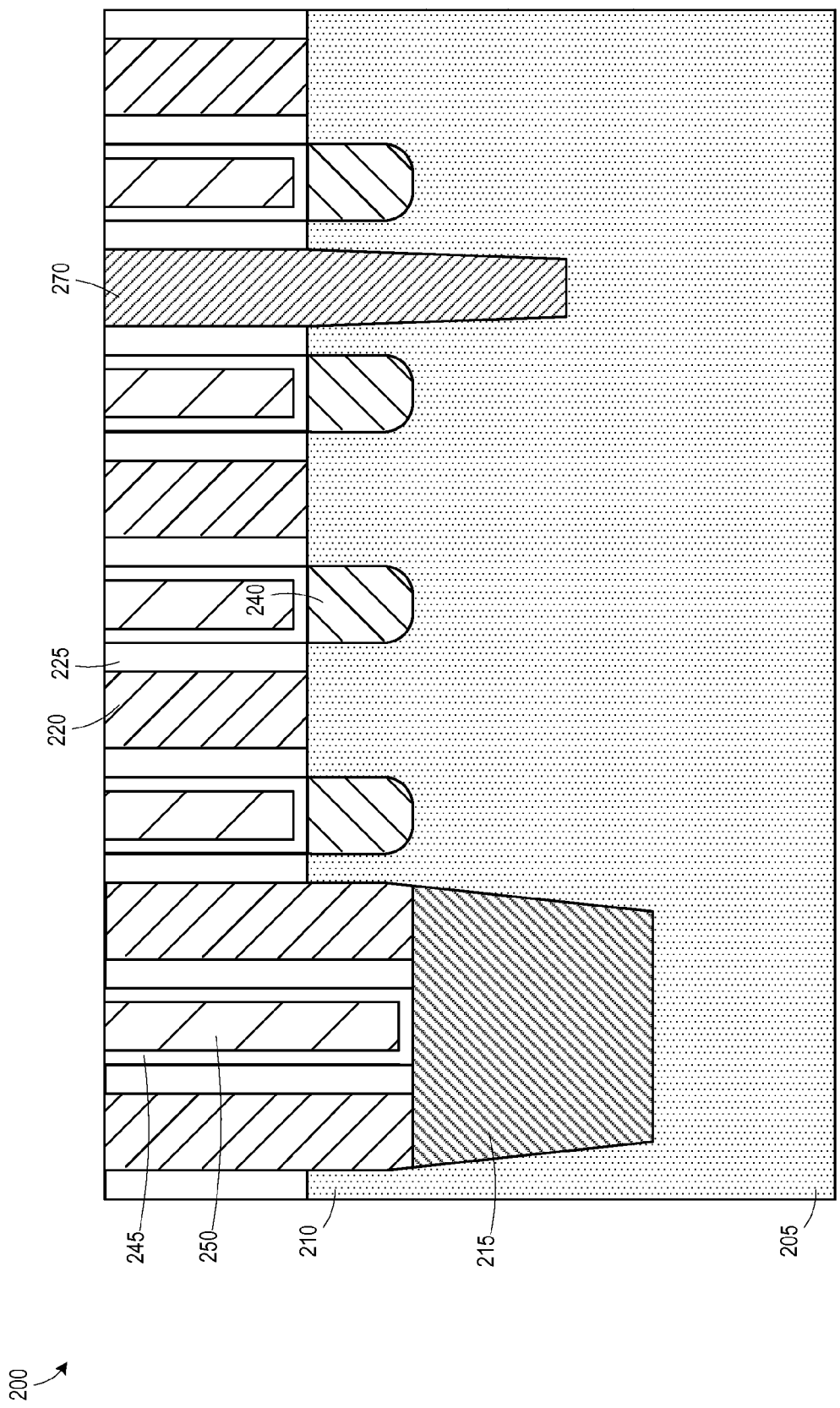

FIG. 2J illustrates the device 200 after a planarization process was performed to remove portions of the dielectric layer 265 and expose the remaining placeholder gate structures 220. The remaining portion of the dielectric layer 265 defines a single diffusion break 270. Because the single diffusion break is formed after the placeholder gate structures 220 were formed (for a replacement technique), the epitaxial material 240 adjacent the single diffusion break 270 has substantially the same profile as the epitaxial material 240 in other recesses 235 formed in the fin. This uniformity improves the performance of the device 100 and reduces the likelihood of defects in the epitaxial material 240 adjacent the single diffusion break 270.

Figure 2K:
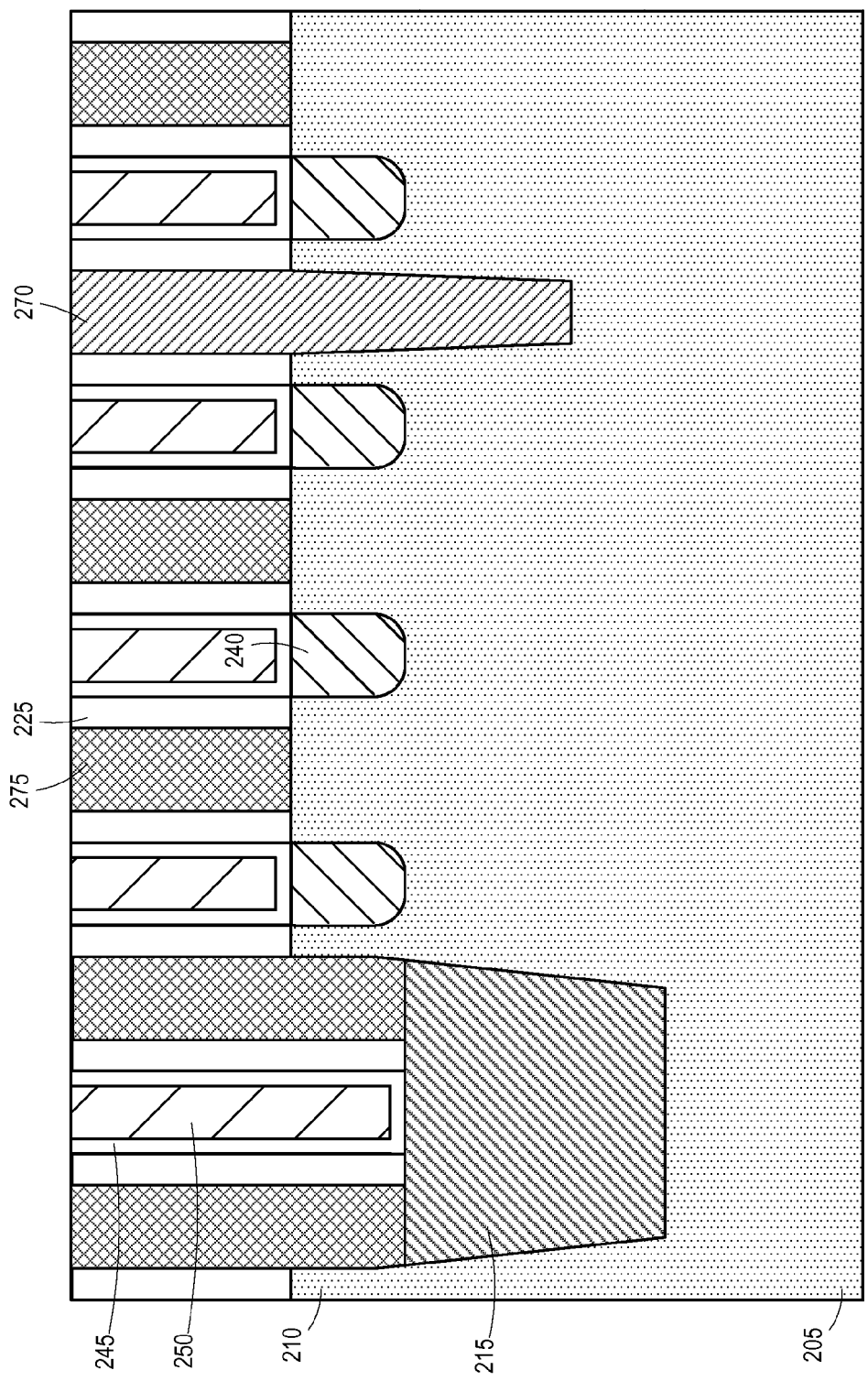

FIG. 2K illustrates the device after a plurality of processes were performed to form replacement gate structures 275 in place of the placeholder gate structures 220. First an etch process was performed to remove the exposed placeholder gate structures 220. The replacement gate structure 275 includes a gate insulation layer (not separately shown) and a conductive gate electrode (not separately shown). The gate insulation layer may include a variety of different deposited or thermally grown materials, such as, for example, silicon dioxide, a so-called high-k (k greater than 10) insulation material, such as hafnium oxide, etc. The conductive gate electrode may include one or more layers, such as one or more layers of exemplary materials, TiN, TiAlN, TiC, TaN, TaC, TaCN or W. After the materials are formed in the replacement gate cavities created by removal of the placeholder gate structures 220, a planarization process may be performed to remove portions of the gate materials positioned outside of the replacement gate cavities.

Figure 2L:
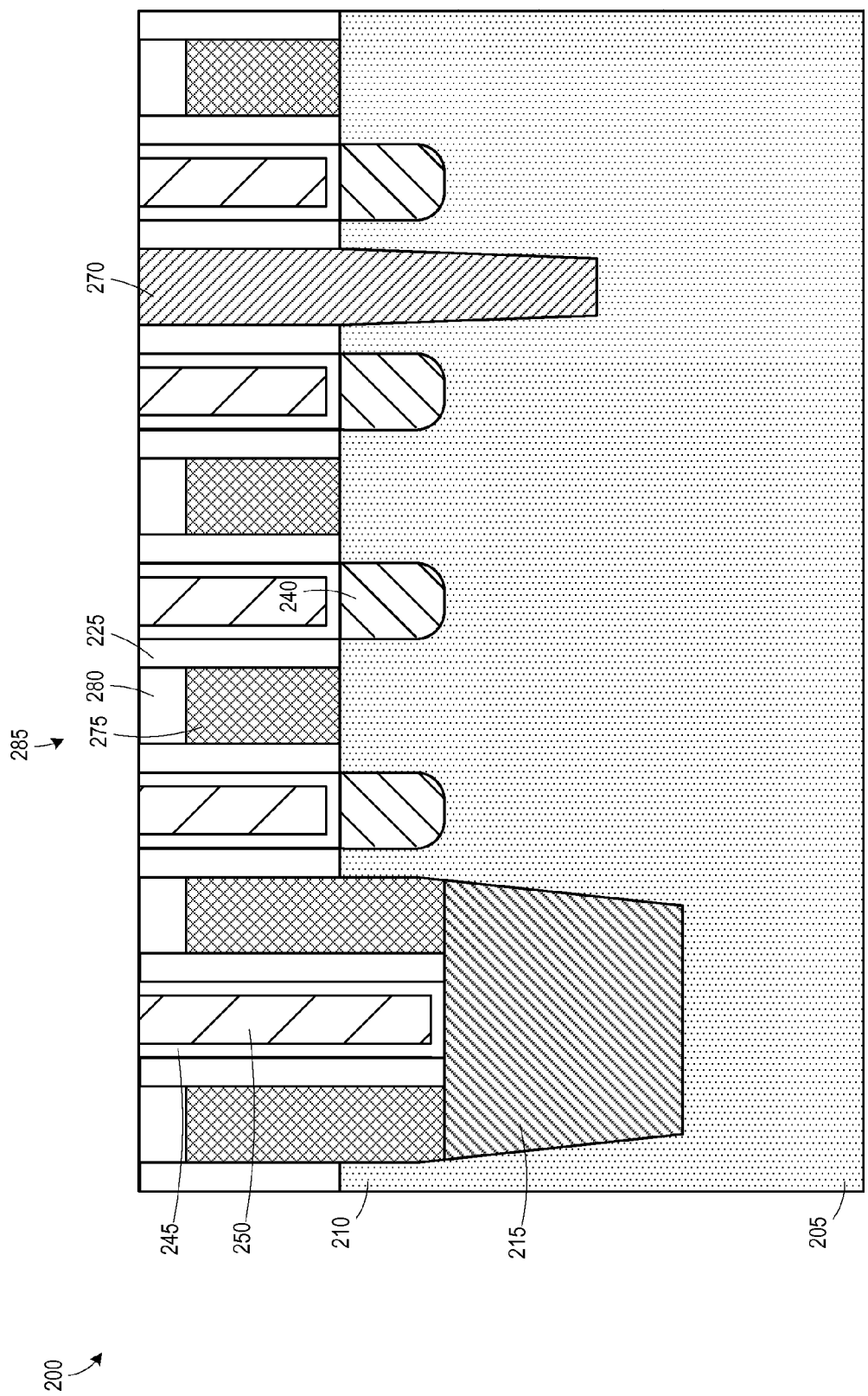

FIG. 2L illustrates the device 200 after several processes were performed to recess the replacement gate structure 275 and form a gate cap 280. The replacement gate structure 275 in combination with the gate cap 280 defines a gate 285 having a height. The gate 285 has a height substantially equal to the height of the single diffusion break 270. The term "substantially equal" refers to the heights of the gate 285 with or without a gate cap layer 280.

The process illustrated in FIGS. 2A-2L includes two planarization processes to expose the placeholder gate structures 220, one for the replacement process of the placeholder gate structures 220A to form the single diffusion break 270 (FIG. 2F), and one for the replacement process to form the replacement gate structures 275 (FIG. 2J). Due to the multiple planarizations, the gate height of the replacement gate structures 275 is reduced.

Figure 3A:
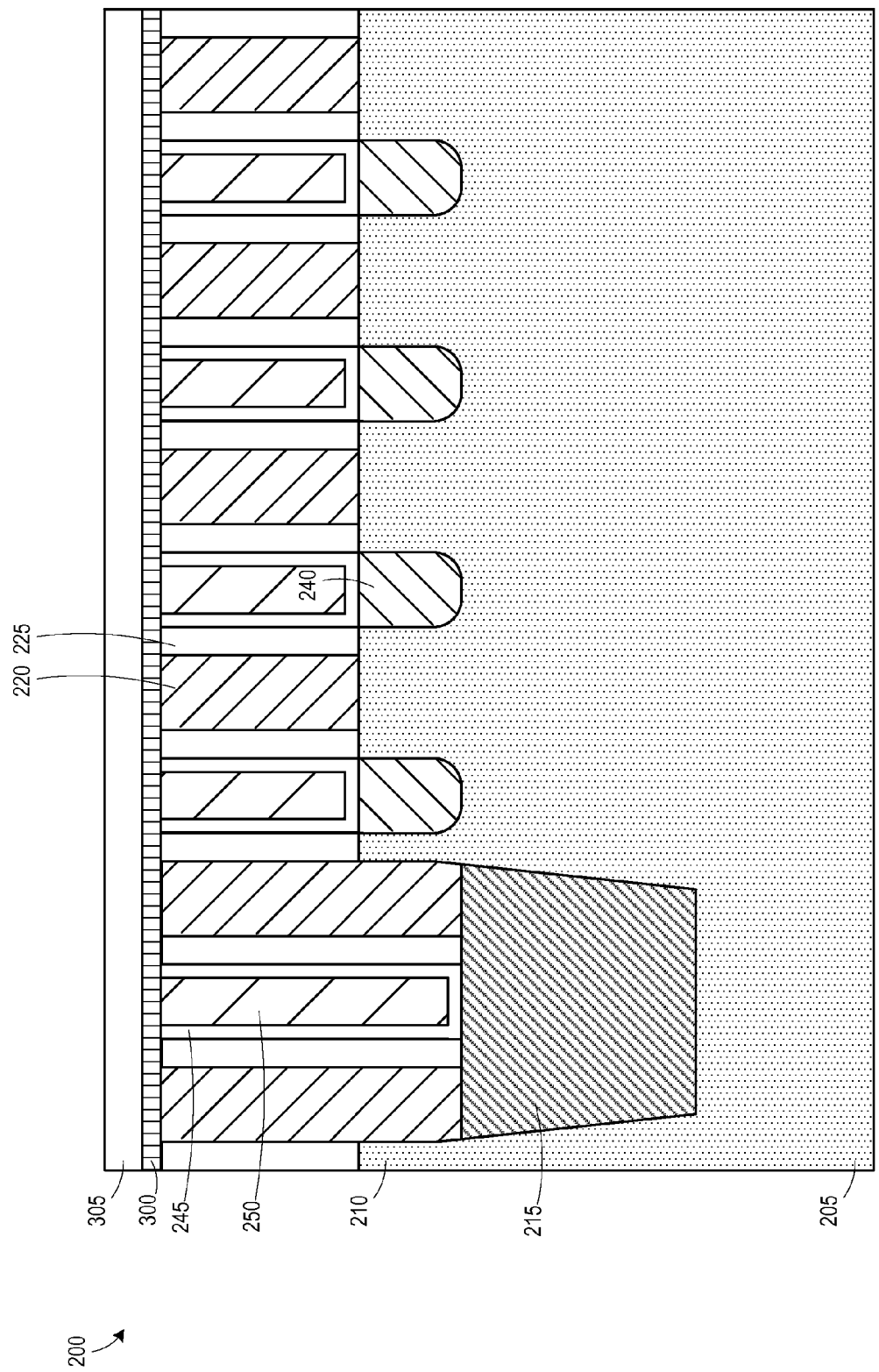

FIGS. 3A-3H illustrate another embodiment of a method for forming a single diffusion break in a finFET device 200. FIG. 3A illustrates the device 200 after the first planarization process shown in FIG. 2F was performed, and after a plurality of deposition processes were performed to deposit a cap layer 300 (e.g., silicon dioxide) and hard mask layer 305 (e.g., silicon nitride) above the ILD layer 250.

Figure 3B:
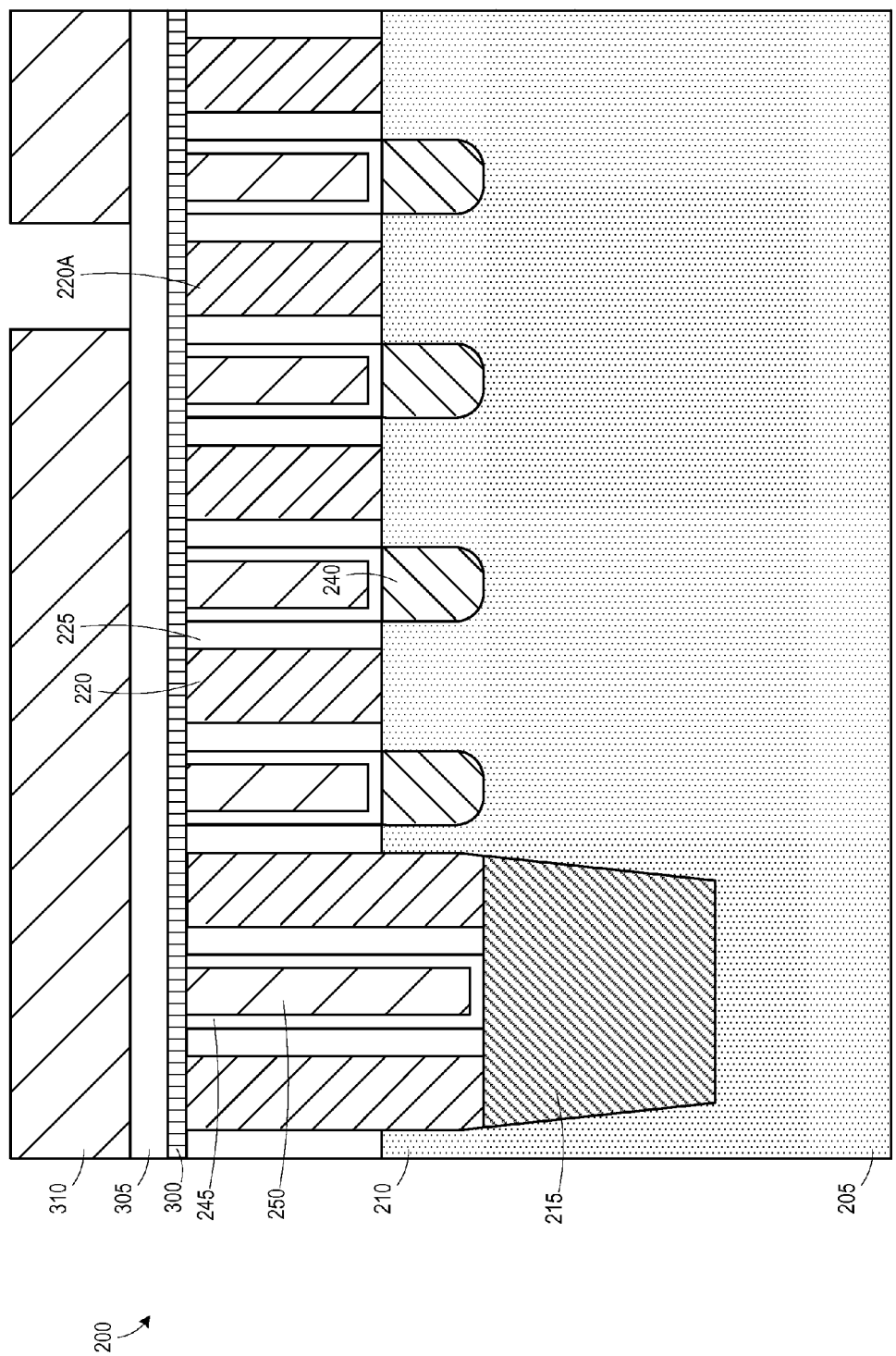

FIG. 3B illustrates the device 200 after a patterned etch mask layer 310 was formed above the hard mask layer 305 to expose a region above the selected placeholder gate structure 220A.

Figure 3C:
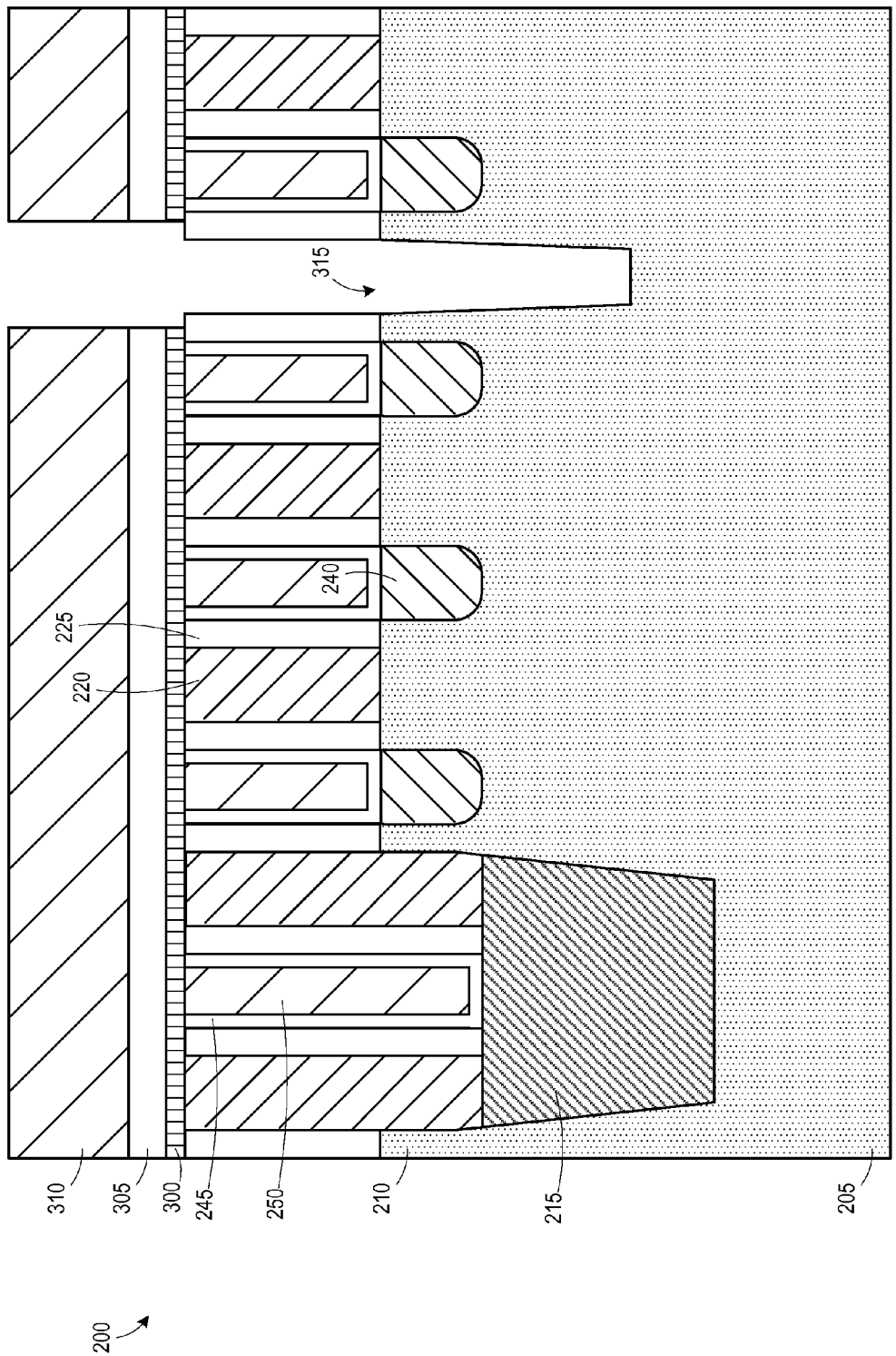

FIG. 3C illustrates the device 200 after one or more anisotropic etch processes were performed to define openings in the hard mask layer 310 and the cap layer 305, to remove the selected placeholder gate structure 220A, and to define a recess 315 in the fin 210.

Figure 3D:
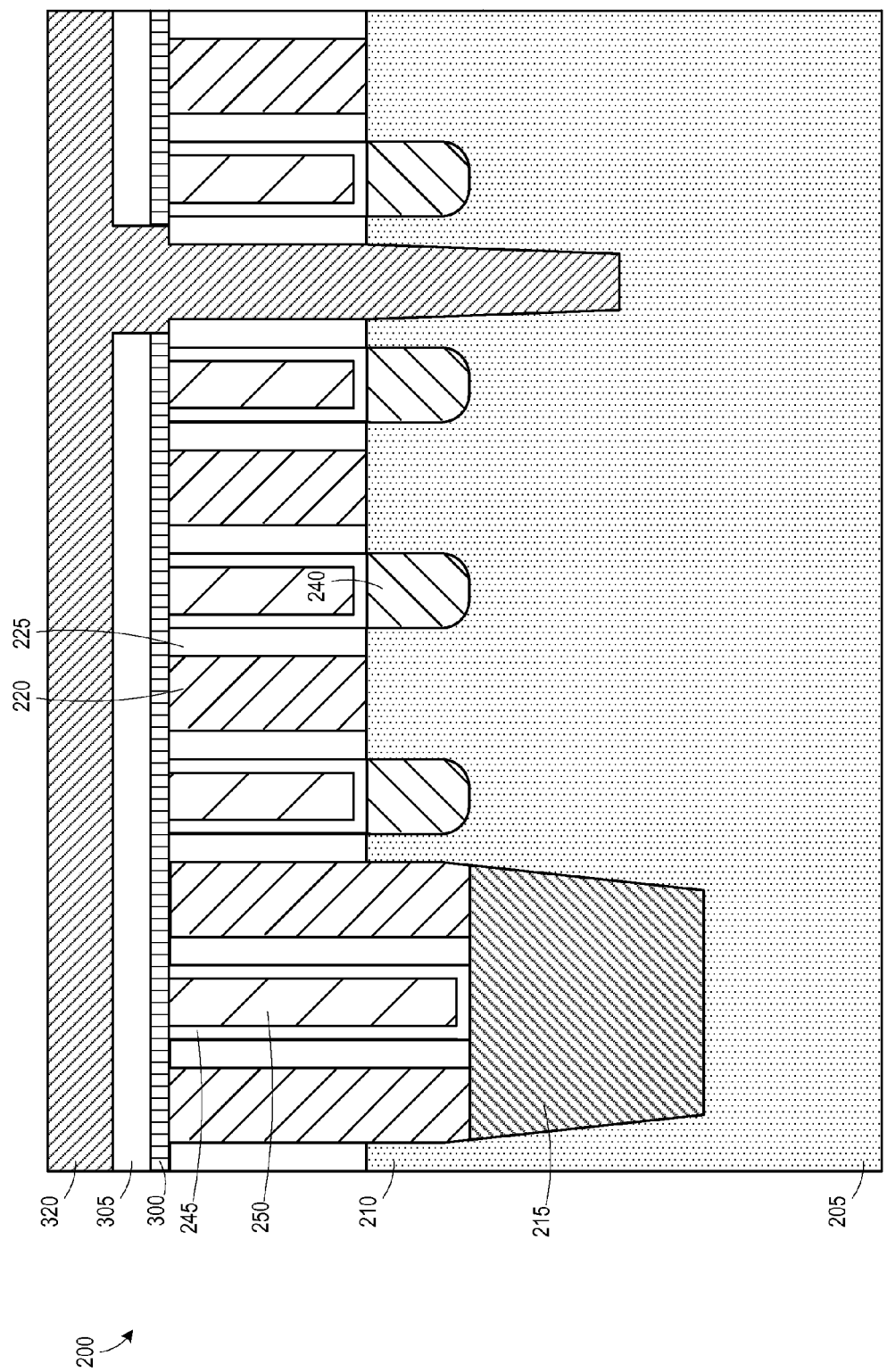

FIG. 3D illustrates the device 200 after a stripping process was performed to remove the mask layer 310 and a deposition process was performed to deposit a dielectric layer 320 (e.g., silicon dioxide) to over-fill the recess 315 and the space created by the removal of the selected placeholder gate structure 220A.

Figure 3E:
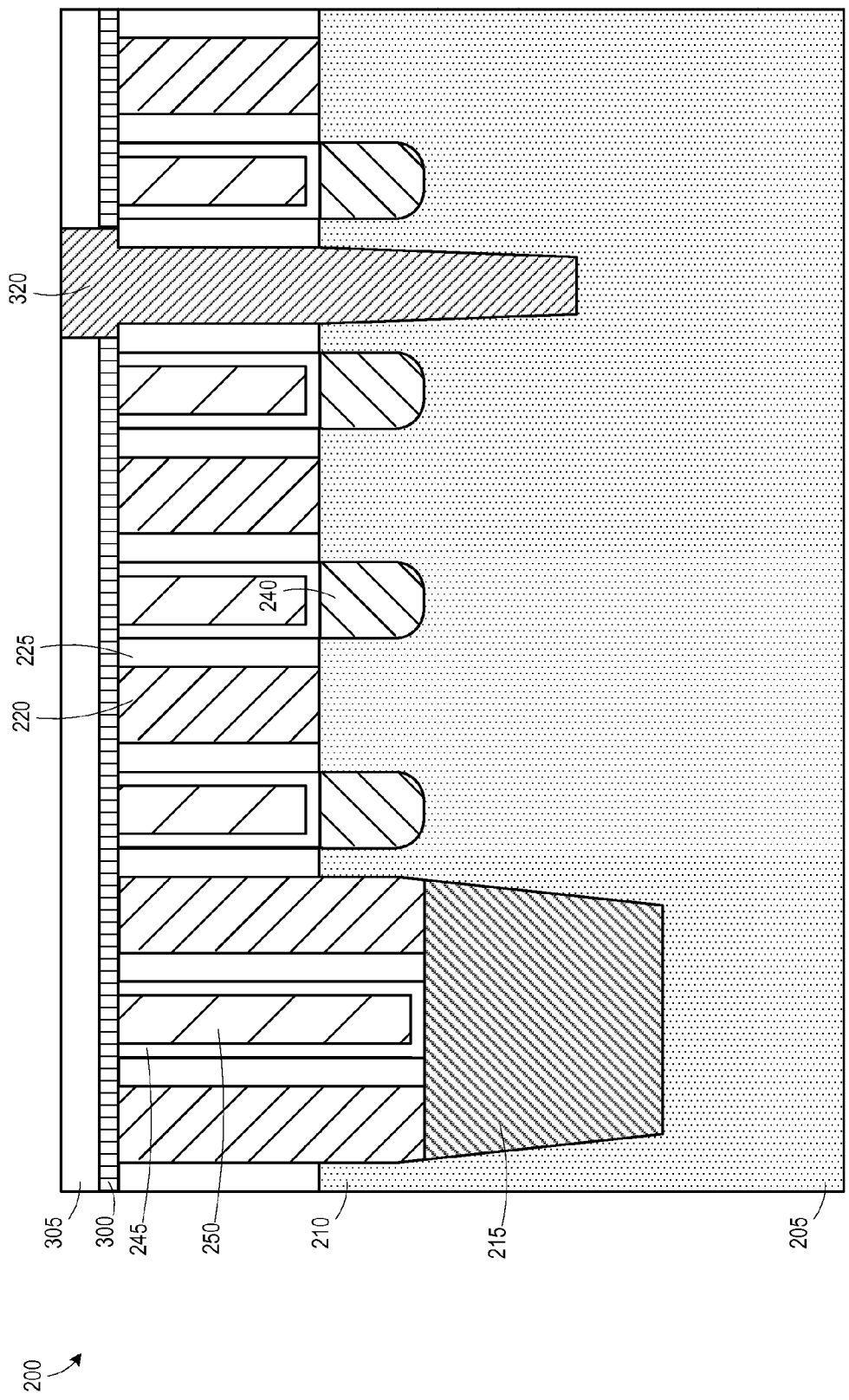

FIG. 3E illustrates the device 200 after a planarization process was performed to remove portions of the dielectric layer 320 using the hard mask layer 305 as a stop layer.

Figure 3F:
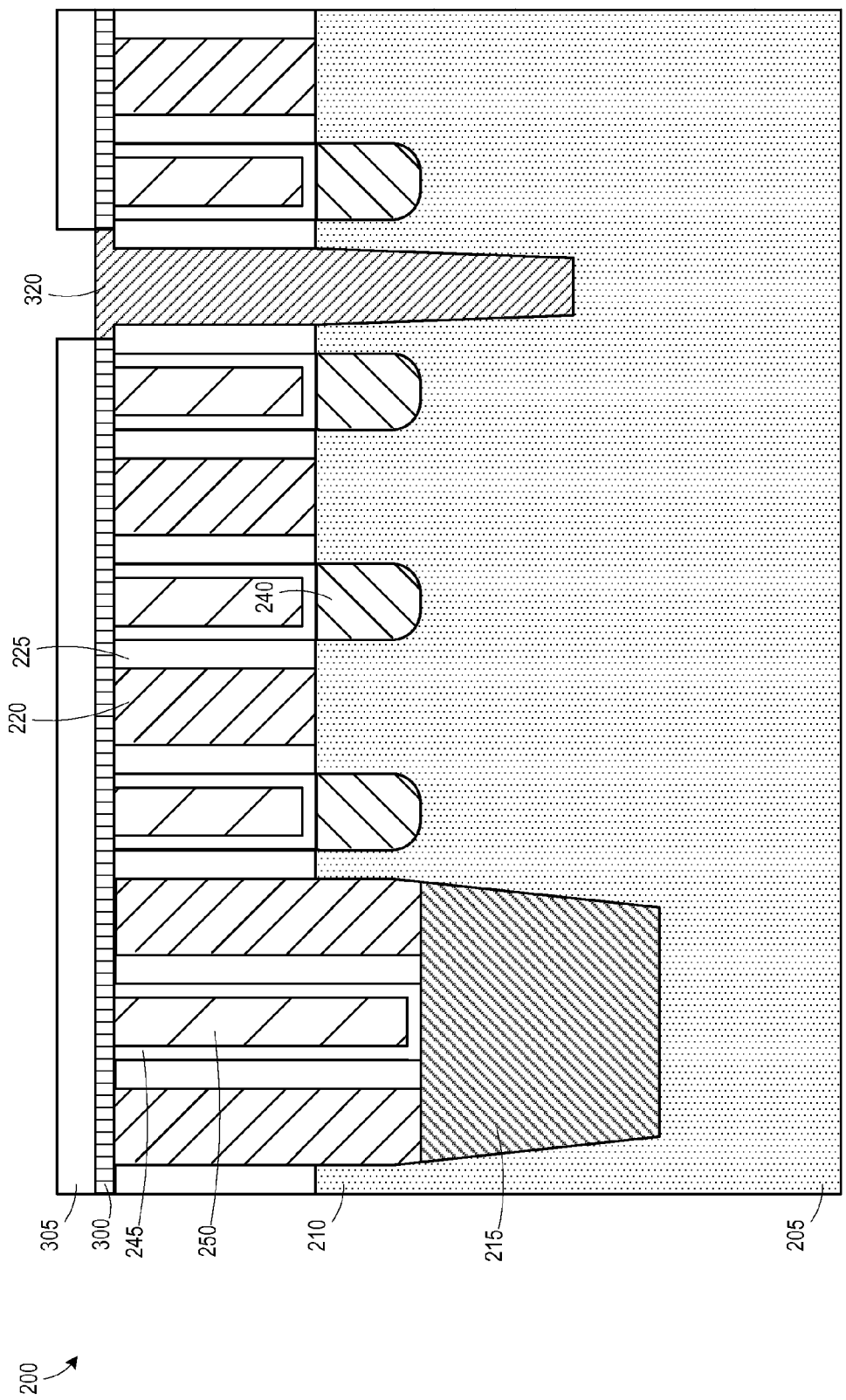

FIG. 3F illustrates the device 200 after a timed, wet etch process was performed to recess the dielectric layer 320 to a height approximately equal to that of the cap layer 300.

Figure 3G:
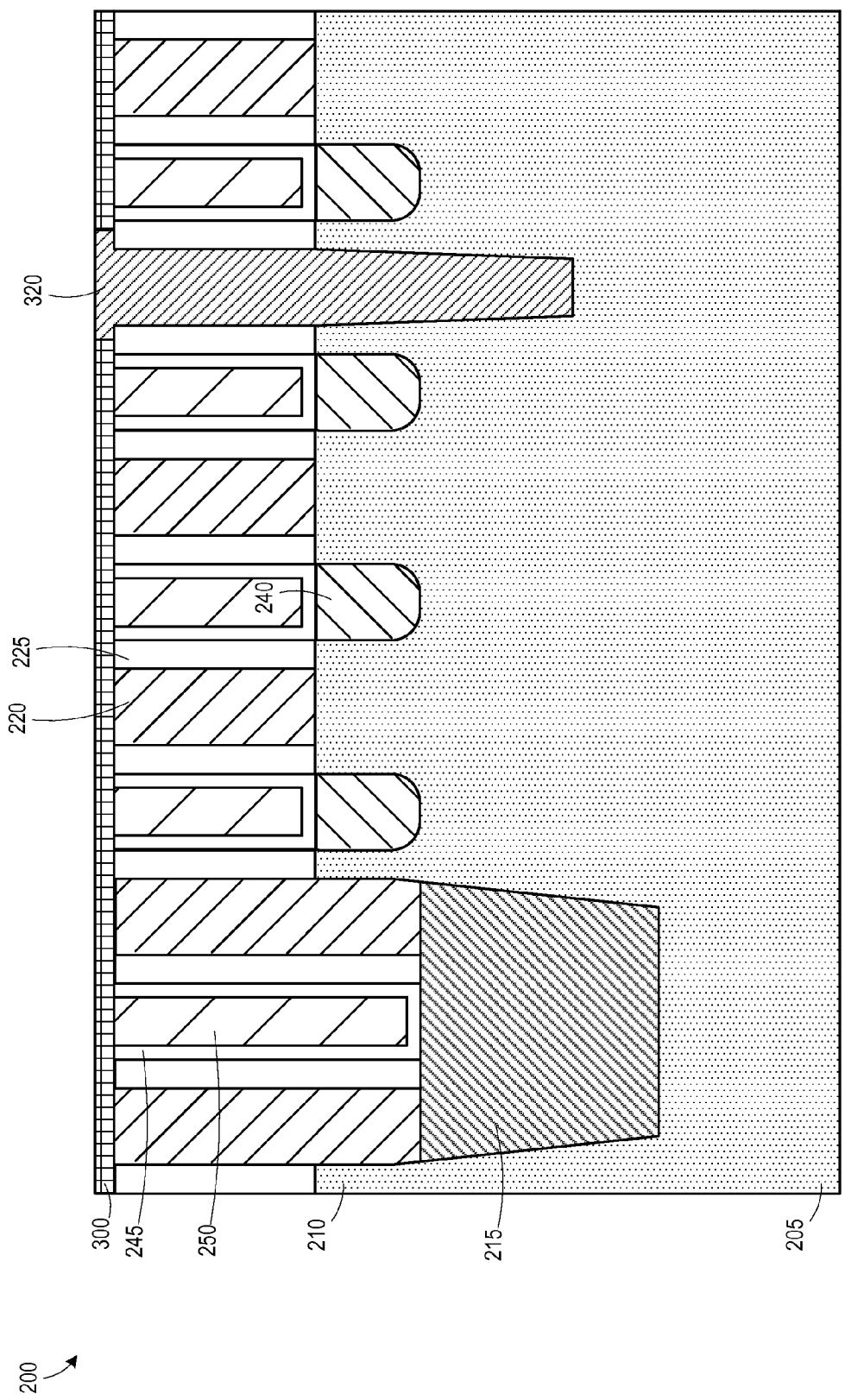

FIG. 3G illustrates the device 200 after an etch process was performed to remove the hard mask layer 305.

FIG. 3H illustrates the device 200 after a timed etch process (e.g., a SiConi™ etch) was performed to remove the cap layer 300 and expose the remaining placeholder gate structures 220. The remaining portion of the dielectric layer 320 defines a single diffusion break 325. Subsequent processing may continue as described in FIGS. 2K-2L to form replacement gate structures. Because the second planarization process is avoided, the height of the replacement gate structures is not reduced as compared to the embodiment illustrated in FIG. 2J.

The methods described herein, including forming increased height fins 210 and recessing the fins in channel regions, reduces the likelihood of source/drain epi overfill, thereby providing uniform raised source/drain height throughout densely-spaced regions and isolated regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method, comprising:
   forming a fin in a semiconductor substrate;
   forming a plurality of sacrificial gate structures above said fin;
   forming an interlayer dielectric layer above said sacrificial gate structures;
   planarizing said interlayer dielectric layer to expose said sacrificial gate structures,
   forming a hard mask layer above said interlayer dielectric layer and above said sacrificial gate structures;
   forming a first opening in said hard mask layer so as to expose a selected one of said sacrificial gate structures;
   removing said selected one of said sacrificial gate structures to define a second opening that exposes a portion of said fin;
   performing an etch process through said second opening on said exposed portion of said fin to define a first recess in said fin;
   forming a dielectric material layer above said hard mask layer so as to fill and first recess and to define a diffusion break in said fin;
   planarizing said dielectric material layer using said hard mask layer as a stop layer; and
   performing an etch process to remove said hard mask layer after planarizing said dielectric material layer.

2. The method of claim 1, further comprising:
   etching said fin to define second recesses adjacent said sacrificial gate structures prior to removing said selected one of said sacrificial gate structures; and
   filling said second recesses with an epitaxial material.

3. The method of claim 1, further comprising replacing said remaining ones of said plurality of sacrificial gate structures with replacement gate structures.

4. The method of claim 1, further comprising
   forming a mask layer above said hard mask layer;
   patterning said mask layer to expose said hard mask layer above said selected one of said sacrificial gate structures; and
   etching said hard mask layer using said mask layer as an etch mask to define said first opening.

5. The method of claim 4, further comprising:
   removing said mask layer; and
   forming said dielectric material layer in said first recess, in said first opening, and in said second opening to define said diffusion break.

6. The method of claim 1, further comprising:
   forming a cap layer above said interlayer dielectric layer and above said sacrificial gate structures prior to forming said hard mask layer, wherein said hard work mask layer is formed above said cap layer and said first opening extends through said cap layer;
   selectively removing a first portion of said dielectric material layer disposed in said first opening after planarizing said dielectric material layer and prior to performing said etch process to remove said hard mask layer; and
   removing said cap layer and a second portion of said dielectric material layer disposed in said second opening so as to expose remaining ones of said plurality of sacrificial gate structures.

7. The method of claim 6, further comprising replacing said remaining ones of said plurality of sacrificial gate structures with replacement gate structures.

8. The method of claim 6, wherein removing said cap layer and a second portion of said dielectric material layer comprises performing a timed etch process.

9. The method of claim 6, wherein selectively removing a first portion of said dielectric material layer further comprises performing a selective etch process.

10. The method of claim 9, wherein said selective etch process comprises a wet etch process.

11. A method, comprising:
    forming a fin in a semiconductor substrate;
    forming a plurality of sacrificial gate structures above said fin;
    forming an interlayer dielectric layer above said sacrificial gate structures;
    planarizing said interlayer dielectric layer to expose said sacrificial gate structures;
    forming a cap layer above said interlayer dielectric layer and above said sacrificial gate structures;
    forming a hard mask layer above said cap layer;
    forming a first opening in said hard mask layer and said cap layer so as to expose a selected one of said sacrificial gate structures;
    removing said selected one of said sacrificial gate structures to define a second opening that exposes a portion of said fin;
    performing an etch process through said second opening on said exposed portion of said fin to define a first recess in said fin;
    forming a dielectric material layer above said hard mask layer so as to fill said first recess and said first and second openings and to define a diffusion break in said fin;
    planarizing said dielectric material layer using said hard mask layer as a stop layer;
    selectively removing a first portion of said dielectric material layer disposed in said first opening after planarizing said dielectric material layer;
    performing an etch process to remove said hard mask layer after selectively removing said first portion of said dielectric material layer;
    removing said cap layer and a second portion of said dielectric material layer disposed in said second opening so as to expose remaining ones of said plurality of sacrificial gate structures; and
    replacing said remaining ones of said plurality of sacrificial gate structures with replacement gate structures.

12. The method of claim 11, wherein removing said cap layer and a second portion of said dielectric material layer comprises performing a timed etch process.

13. The method of claim 11, wherein selectively removing a first portion of said dielectric material layer further comprises performing a selective etch process.

14. The method of claim 13, wherein said selective etch process comprises a wet etch process.

\* \* \* \* \*